US012132295B2

(12) United States Patent
Kondo et al.

(10) Patent No.: US 12,132,295 B2
(45) Date of Patent: Oct. 29, 2024

(54) LIGHT-EMITTING DEVICE, OPTICAL DEVICE, MEASURING DEVICE, AND INFORMATION PROCESSING DEVICE

(71) Applicant: FUJIFILM Business Innovation Corp., Tokyo (JP)

(72) Inventors: Takashi Kondo, Kanagawa (JP); Satoshi Inada, Kanagawa (JP); Junichiro Hayakawa, Kanagawa (JP); Takeshi Minamiru, Kanagawa (JP); Takafumi Higuchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 969 days.

(21) Appl. No.: 17/120,240

(22) Filed: Dec. 13, 2020

(65) Prior Publication Data
US 2021/0305773 A1   Sep. 30, 2021

(30) Foreign Application Priority Data

Mar. 25, 2020 (JP) ................. 2020-055032

(51) Int. Cl.
| | |
|---|---|
| *H01S 5/042* | (2006.01) |
| *G01S 7/484* | (2006.01) |
| *G01S 17/10* | (2020.01) |
| *H01S 5/02257* | (2021.01) |
| *H01S 5/42* | (2006.01) |

(52) U.S. Cl.
CPC ............ *H01S 5/0428* (2013.01); *G01S 7/484* (2013.01); *G01S 17/10* (2013.01); *H01S 5/02257* (2021.01); *H01S 5/423* (2013.01)

(58) Field of Classification Search
CPC ........ G01S 7/4814; G01S 7/484; G01S 17/10; G01S 17/88; G02B 27/42; G02B 27/4272; G06F 21/32; H01L 33/005; H01S 5/02257; H01S 5/0239; H01S 5/0428; H01S 5/0683; H01S 5/183; H01S 5/423
See application file for complete search history.

(56) References Cited

U.S. PATENT DOCUMENTS

| | | | |
|---|---|---|---|
| 7,948,004 B2 | 5/2011 | Suzuki | |
| 10,466,613 B2 | 11/2019 | Kondo et al. | |
| 10,983,197 B1 * | 4/2021 | Zhu | ......... G01S 17/10 |

(Continued)

FOREIGN PATENT DOCUMENTS

| | | | | |
|---|---|---|---|---|
| EP | 2607948 A1 * | 6/2013 | ....... | G02F 1/133603 |
| JP | H01238962 | 9/1989 | | |

(Continued)

OTHER PUBLICATIONS

"Office Action of Japan Counterpart Application", issued on Nov. 14, 2023, with English translation thereof, p. 1-p. 6.

*Primary Examiner* — Yuqing Xiao
*Assistant Examiner* — Benjamin Richard Hebert
(74) *Attorney, Agent, or Firm* — JCIPRNET

(57) ABSTRACT

A light-emitting device is provided with a light source and a controller. The light source includes multiple light-emitting elements and multiple driving elements that are provided in correspondence with the light-emitting elements and drive the light-emitting elements to light up by going to an ON state. The controller controls a switching between a successive lighting operation that causes the light-emitting elements to light up successively and a simultaneous lighting operation that causes the light-emitting elements to light up simultaneously in parallel. The light source includes a power supply line set to a reference potential or a power supply potential, a driving signal line that is connected to the power supply line and that supplies a driving signal to the driving elements, and a lighting signal line that supplies a lighting signal for causing the light-emitting elements to light up. In the successive lighting operation, the controller sets the power supply line to the power supply potential and sets each driving element to the ON state with the driving signal and the lighting signal to cause each light-emitting element corresponding to each driving element to light up successively. In the simultaneous lighting operation, the (Continued)

controller sets the power supply line to the reference potential and also sets the driving elements to the ON state with the driving signal and the lighting signal to cause the light-emitting elements to light up simultaneously in parallel.

15 Claims, 14 Drawing Sheets

(56) References Cited

U.S. PATENT DOCUMENTS

| | | | |
|---|---|---|---|
| 2007/0057259 A1* | 3/2007 | Nagumo | B41J 2/45 |
| | | | 257/E25.032 |
| 2010/0026214 A1* | 2/2010 | Nagumo | G03G 15/04054 |
| | | | 315/312 |
| 2015/0258990 A1* | 9/2015 | Stettner | B62D 15/0265 |
| | | | 701/1 |
| 2019/0082511 A1* | 3/2019 | Bong | H05B 45/20 |
| 2020/0119522 A1* | 4/2020 | Burroughs | H01S 5/02375 |
| 2020/0178361 A1* | 6/2020 | Oka | G01S 7/4815 |
| 2020/0303896 A1* | 9/2020 | Ohta | B25J 19/022 |

FOREIGN PATENT DOCUMENTS

| | | | |
|---|---|---|---|
| JP | 2001308385 | | 11/2001 |
| JP | 3604474 B2 | * | 12/2004 |
| JP | 2009286048 | | 12/2009 |
| JP | 2014012384 | | 1/2014 |
| JP | 2015014700 | | 1/2015 |
| JP | 2015014700 A | * | 1/2015 |
| JP | 2018144477 | | 9/2018 |

* cited by examiner

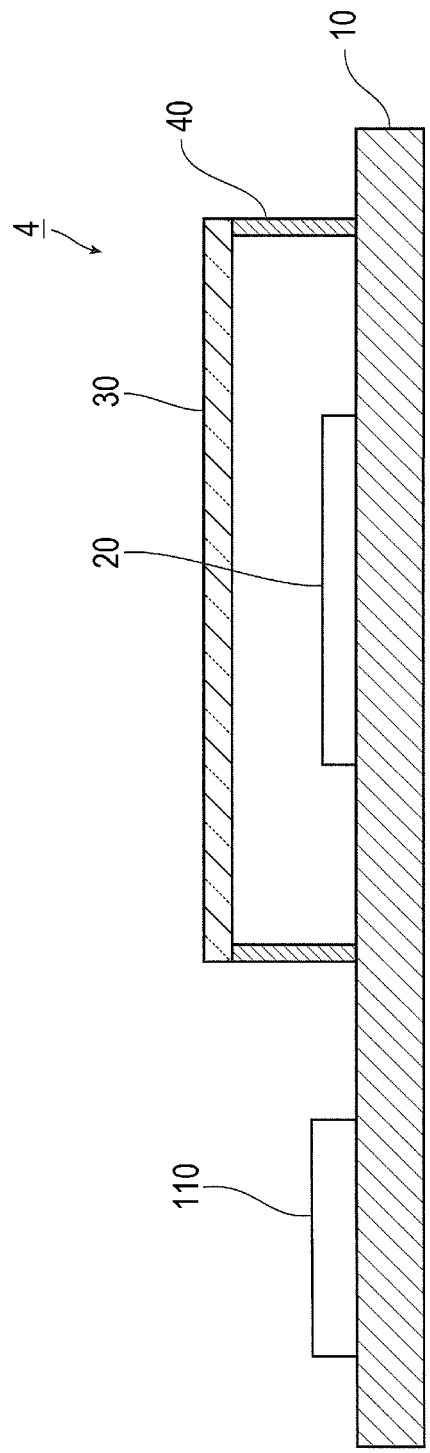

FIG. 10

| LD44 ON | LD34 OFF | LD24 OFF | LD14 ON |
|---|---|---|---|
| LD43 ON | LD33 OFF | LD23 ON | LD13 OFF |
| LD42 OFF | LD32 ON | LD22 OFF | LD12 ON |
| LD41 ON | LD31 ON | LD21 ON | LD11 ON |

| LD14 ON | LD13 OFF | LD12 ON | LD11 ON |
|---------|----------|---------|---------|
| LD24 OFF | LD23 ON | LD22 OFF | LD21 ON |
| LD34 ON | LD33 OFF | LD32 ON | LD31 OFF |
| LD44 ON | LD43 OFF | LD42 ON | LD41 ON |

LIGHT-EMITTING DEVICE, OPTICAL DEVICE, MEASURING DEVICE, AND INFORMATION PROCESSING DEVICE

CROSS-REFERENCE TO RELATED APPLICATIONS

This application is based on and claims priority under 35 USC 119 from Japanese Patent Application No. 2020-055032 filed Mar. 25, 2020.

BACKGROUND

(i) Technical Field

The present disclosure relates to a light-emitting device, an optical device, a measuring device, and an information processing device.

(ii) Related Art

Japanese Unexamined Patent Application Publication No. H01-238962 describes a light-emitting element array in which a large number of light-emitting elements are arranged in a one-dimensional, two-dimensional, or three-dimensional array. The threshold voltage or threshold current of the light-emitting elements is controllable by external light. At least a portion of the light emitted from each light-emitting element is configured to be incident on another light-emitting element nearby. A clock line that applies an external voltage or current is connected to each light-emitting element.

Japanese Unexamined Patent Application Publication No. 2001-308385 describes a self-scanning light-emitting device containing light-emitting elements in a pnpnpn 6-layer semiconductor structure. The p-type first layer and the n-type sixth layer on either end as well as the p-type third layer and the n-type fourth layer in the middle are provided with electrodes. A pn layer is made to function as a light-emitting diode, while a pnpn 4-layer is made to function as a thyristor.

Japanese Unexamined Patent Application Publication No. 2009-286048 describes a self-scanning light source head provided with a substrate, surface-emitting semiconductor lasers arranged in an array on the substrate, and a thyristor acting as a switch that selectively controls the ON/OFF state of the surface-emitting semiconductor lasers.

SUMMARY

In the case of measuring the three-dimensional shape of an object of measurement on the basis of the time taken by light to travel, also referred to as the time of flight (ToF) method, there is a light-emitting device provided with multiple light-emitting elements acting as light sources that irradiate the object of measurement with light. The light-emitting device causes the multiple light-emitting elements to emit light successively. In such a light-emitting device, there is a demand to cause some or all of the multiple light-emitting elements to emit light simultaneously in parallel.

Aspects of non-limiting embodiments of the present disclosure relate to causing multiple light-emitting elements to emit light successively and also cause some or all the light-emitting elements to emit light in parallel.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a light-emitting device provided with a light source and a controller. The light source includes multiple light-emitting elements and multiple driving elements that are provided in correspondence with the light-emitting elements and drive the light-emitting elements to light up by going to an ON state. The controller controls a switching between a successive lighting operation that causes the light-emitting elements to light up successively and a simultaneous lighting operation that causes the light-emitting elements to light up simultaneously in parallel. The light source includes a power supply line set to a reference potential or a power supply potential, a driving signal line that is connected to the power supply line and that supplies a driving signal to the driving elements, and a lighting signal line that supplies a lighting signal for causing the light-emitting elements to light up. In the successive lighting operation, the controller sets the power supply line to the power supply potential and sets each driving element to the ON state with the driving signal and the lighting signal to cause each light-emitting element corresponding to each driving element to light up successively. In the simultaneous lighting operation, the controller sets the power supply line to the reference potential and also sets the driving elements to the ON state with the driving signal and the lighting signal to cause the light-emitting elements to light up simultaneously in parallel.

BRIEF DESCRIPTION OF THE DRAWINGS

Exemplary embodiments of the present disclosure will be described in detail based on the following figures, wherein:

FIG. 3 is a cross section of a light-emitting device taken along the line III-III in FIG. 2;

FIGS. 4A and 4B are diagrams for explaining an example of a light diffusion member, in which FIG. 4A is a plan view and FIG. 4B is a cross section taken along the line IVB-IVB in FIG. 4A;

FIG. 10 is a diagram illustrating an example of controlling the lighted/unlighted state of laser diodes in a light source provided with 4×4 laser diodes applying the third exemplary embodiment;

DETAILED DESCRIPTION

Figure 1:
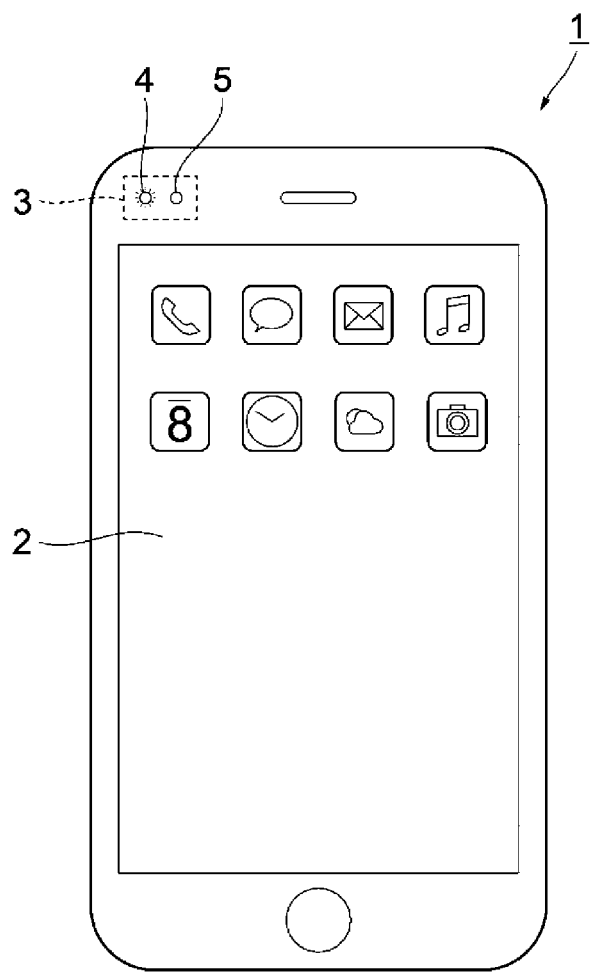
FIG. 1 is a diagram illustrating an example of an information processing device.

Hereinafter, exemplary embodiments of the present disclosure will be described in detail and with reference to the attached drawings.

Measuring devices that measure the three-dimensional shape of an object of measurement include devices that measure the three-dimensional shape on the basis of the time taken by light to travel, also referred to as the time of flight (ToF) method. The ToF method measures the length of time from a timing at which light is emitted from a light-emitting device provided in the measuring device until a timing at which the radiated light is reflected by the object of measurement and received by a three-dimensional sensor (hereinafter referred to as a 3D sensor) provided in the measuring device, and specifies the three-dimensional shape of the object of measurement from the measured three-dimensional shape. Note that the target whose three-dimensional shape is to be measured is referred to as the object of measurement. The three-dimensional shape may also be referred to as a three-dimensional image. Also, the action of measuring a three-dimensional shape may also be referred to as three-dimensional measurement, 3D measurement, or 3D sensing.

Such a measuring device is installed in a device such as a mobile information processing device, and is used for applications such as facial authentication of a user attempting to access the information processing device. In the related art, mobile information processing devices and the like use a variety of methods to authenticate users, such as methods based on a password, a fingerprint, or the iris of the eye. In recent years, there has been demand for a more secure authentication method. Accordingly, mobile information processing devices have been equipped with measuring devices that measure three-dimensional shapes. In other words, the three-dimensional shape of the accessing user's face is acquired to determine whether or not access is permitted, and the use of the device itself (the mobile information processing device) is permitted only in the case where the face is authenticated as the face of an authorized user.

Here, an example will be described in which the information processing device is a mobile information processing terminal, and the user is authenticated by recognizing the shape of the user's face captured as a three-dimensional shape. Note that the information processing device may also be applied to an information processing device other than a mobile information processing terminal, such as a personal computer (PC).

The configurations, functions, methods, and the like described in the exemplary embodiments may also be applied to an object of measurement other than the face, and the object of measurement may be recognized from the measured three-dimensional shape. Furthermore, such a measuring device is also applicable to the case of ongoing measurement of the three-dimensional shape of an object of measurement, such as with augmented reality (AR) and the like. Also, the object of measurement may exist at any distance. In face authentication, it is sufficient to radiate light onto a face positioned a short distance away from the light source, but in applications such as augmented reality, there is a demand to radiate light onto an object of measurement positioned farther away compared to the face. Consequently, a high-intensity light source is demanded.

The configurations, functions, methods, and the like described in the exemplary embodiments hereinafter may also be applied to measuring the three-dimensional shape of an object of measurement in applications other than face authentication and augmented reality.

First Exemplary Embodiment (Information Processing Device 1)

FIG. 1 is a diagram illustrating an example of an information processing device 1. As described above, the information processing device 1 is a mobile information processing terminal as an example.

The information processing device 1 is provided with a user interface (hereinafter referred to as a UI) unit 2 and an optical device 3 that measures three-dimensional shapes. The UI unit 2 is the integration of a display device that displays information to a user and an input device that accepts the input of instructions for information processing given by user operations, for example. The display device is a liquid crystal display or an organic EL display for example, while the input device is a touch panel for example.

The optical device 3 is provided with a light-emitting device 4 and a 3D sensor 5. The light-emitting device 4 radiates light toward an object of measurement, which is a face in this example. The 3D sensor 5 acquires returning light that is emitted from the light-emitting device 4 and reflected by the face. Here, the three-dimensional shape is measured on the basis of the time taken by the light to travel, also referred to as the ToF method. Thereafter, the three-dimensional shape of the face is specified from the measured three-dimensional shape. Additionally, from the specified three-dimensional shape of the face, it is determined whether or not access is permitted, and the use of the information processing device 1 is permitted in the case where the face is authenticated as the face of an authorized user. As described above, the three-dimensional shape of an object of measurement other than a face may also be measured. The 3D sensor 5 is an example of a light receiver.

The information processing device 1 is configured as a computer including components such as a central processing unit (CPU), read-only memory (ROM), and random access memory (RAM). Note that the ROM includes non-volatile rewritable memory, such as flash memory for example. Additionally, by causing programs and constants stored in the ROM to be loaded into the RAM and by causing the CPU to execute a program, the information processing device 1 operates, and various information processing is executed.

Figure 2:
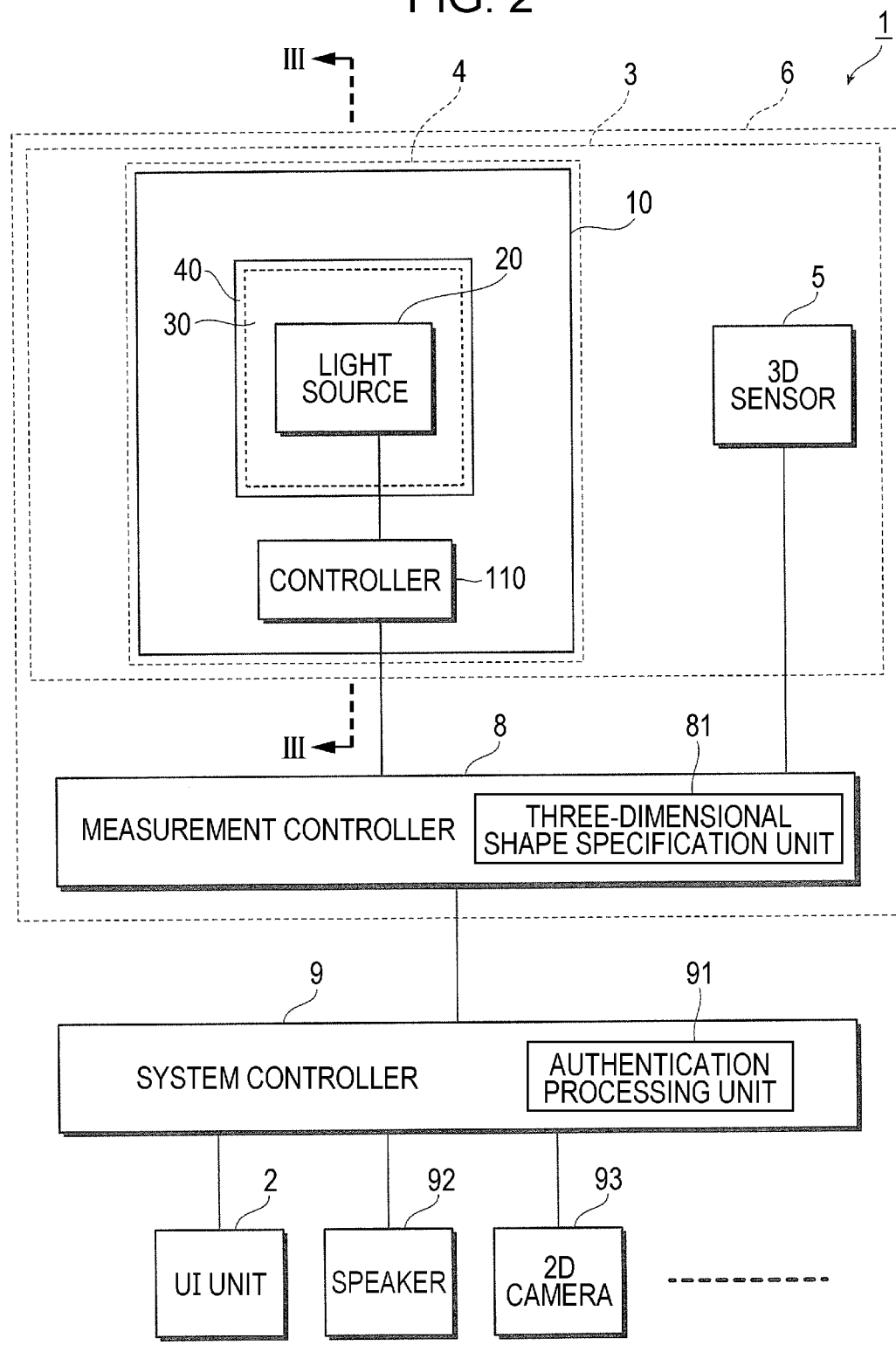
FIG. 2 is a block diagram for describing a configuration of an information processing device.

FIG. 2 is a block diagram for describing a configuration of the information processing device 1.

The information processing device 1 is provided with the optical device 3 described above, a measurement controller 8, and a system controller 9. As described above, the optical device 3 is provided with the light-emitting device 4 and the 3D sensor 5. The measurement controller 8 controls the optical device 3. Additionally, the measurement controller 8 includes a three-dimensional shape specification unit 81. The system controller 9 controls the entire information processing system 1 as a system. Additionally, the system controller 9 includes an authentication processing unit 91. Furthermore, components such as the UI unit 2, a speaker 92, a two-dimensional camera (referred to as a 2D camera in FIG. 2) 93 are connected to the system controller 9.

The light-emitting device 4 provided in the optical device 3 is provided with a circuit substrate 10, a light source 20, a light diffusion member 30, a controller 110, and a retaining unit 40. The light source 20, the controller 110, and the retaining unit 40 are provided on the surface of the circuit substrate 10. Additionally, the light diffusion member 30 is provided on the retaining unit 40. The controller 110 is connected to the light source 20 and controls the light source 20. Note that in FIG. 2, the 3D sensor 5 is not provided on the surface of the circuit substrate 10, but the 3D sensor 5 may also be provided on the surface of the circuit substrate 10. Also, the controller 110 does not have to be provided on the surface of the circuit substrate 10. Here, the surface refers to the front side of the page of FIG. 2. More specifically, the face provided with the light source 20 in the circuit substrate 10 is referred to as the surface, the front side, or the surface side. The same applies to the other members. In the following, a diagram illustrating a member from the surface side will be referred to as a plan view.

The controller 110 includes an electronic circuit. For example, the controller 110 is configured as an integrated circuit (IC).

The 3D sensor 5 is provided with multiple light-receiving cells, and outputs a signal corresponding to the length of time from the timing at which light is emitted from the light source 20 until the timing at which light is received by the 3D sensor 5. For example, each light-receiving cell in the 3D sensor 5 receives pulses of reflected light (hereinafter referred to as received light pulses) from the object of measurement corresponding to emitted light pulses from the light source 20, and stores an electric charge corresponding to the length of time until the light was received for each light-receiving cell. The 3D sensor 5 is configured as a device having a CMOS structure in which each light-receiving cell is provided with two gates and corresponding charge storage units. Additionally, by applying pulses to the two gates in alternation, generated photoelectrons are quickly transferred to one of the two charge storage units. In the two charge storage units, electric charge is stored according to the phase difference between the emitted light pulses and the received light pulses. Thereafter, the 3D sensor 5 outputs a digital value corresponding to the phase difference between the emitted light pulses and the received light pulses for each light-receiving cell as a signal through an AD converter. In other words, the 3D sensor 5 outputs a signal corresponding to the length of time from the timing at which light is emitted from the light source 20 until the timing at which light is received by the 3D sensor 5. That is to say, a signal corresponding to the three-dimensional shape of the object of measurement is acquired from the 3D sensor 5. Consequently, there is a demand for the emitted light pulses to have a short rising time and for the received light pulses to have a short rising time. In other words, there is a demand for the current pulses supplied to drive the light source 20 to have a short rising time. Note that the AD converter may be provided in the 3D sensor 5 or externally to the 3D sensor 5. The 3D sensor 5 is an example of a light receiver.

In the case where the 3D sensor 5 is a device having the CMOS structure described above for example, the three-dimensional shape specification unit 81 of the measurement controller 8 acquires the digital value obtained from each light-receiving cell and computes the distance to the object of measurement for each light-receiving cell. Additionally, the three-dimensional shape specification unit 81 specifies the three-dimensional shape of the object of measurement according to the computed distance, and outputs a specification result. Here, the three-dimensional shape specification unit 81 functions as a distance specifier that specifies the distance to the object of measurement.

The authentication processing unit 91 provided in the system controller 9 determines whether or not access is permitted from the three-dimensional shape specified by the three-dimensional shape specification section 81, and authenticates an authorized user.

In FIG. 2, a measuring device 6 is provided with the optical device 3 and the measurement controller 8. In FIG. 2, the optical device 3 and the measurement controller 8 are illustrated as separate components, but may also be integrated into one.

FIG. 3 is a cross section of the light-emitting device 4 taken along the line III-III in FIG. 2.

As illustrated in FIG. 3, the light diffusion member 30 is provided to cover the light source 20. The light diffusion member 30 is provided at a predetermined distance from the light source 20 provided on the circuit substrate 10 by the retaining unit 40 provided on the surface of the circuit substrate 10. In other words, the light diffusion member 30 is provided on the emission path of the light from the light source 20.

Figure 4A:
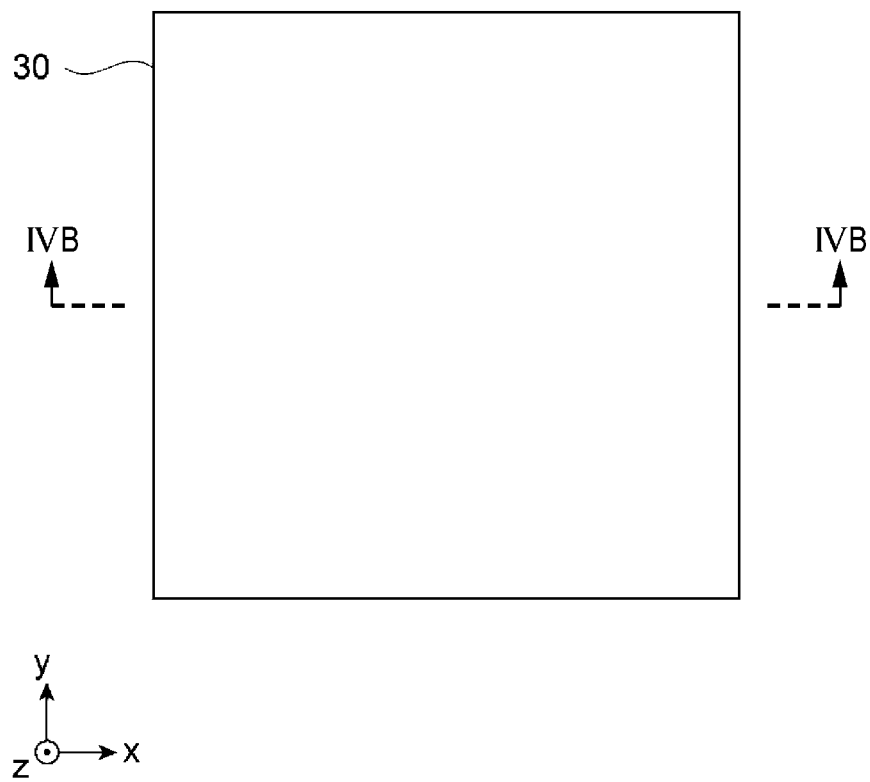
Figure 4B:
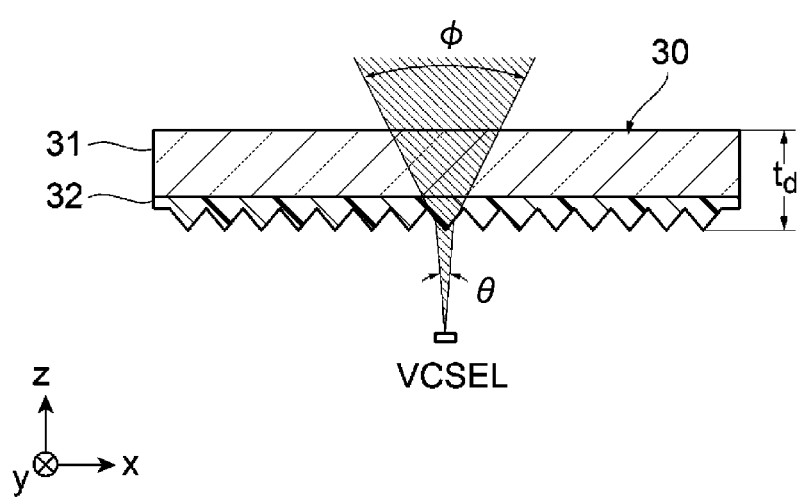

FIGS. 4A and 4B are diagrams for explaining an example of the light diffusion member 30, in which FIG. 4A is a plan view and FIG. 4B is a cross section taken along the line IVB-IVB in FIG. 4A. In FIG. 4A, the rightward direction of the page is treated as the x direction, the upward direction of the page is treated as the y direction, and the front direction of the page is treated as the z direction. Additionally, in the light diffusion member 30, the +z side is called the surface or surface side, while the −z side is called the back or back side. Consequently, in FIG. 4B, the rightward direction of the page is treated as the x direction, the back direction of the page is treated as the y direction, and the upward direction of the page is treated as the z direction.

As illustrated in FIG. 4B, in the light diffusion member 30, a resin layer 32 having an irregular surface for diffusing light is provided on the back face (−z direction) of a flat glass base material 31 having parallel surfaces, for example. The light diffusion member 30 receives light incident from the light source 20 and emits the light with a widened spread angle. In other words, the irregularities formed in the resin layer 32 of the light diffusion member 30 refract and scatter light, causing incident light to be emitted as light with a wider spread angle. In other words, as illustrated in FIG. 4B, in the light diffusion member 30, light having a spread angle θ emitted from the light source 20 and incident from the back side (−z side) is emitted from the surface (+z side) as light having a spread angle φ that is greater than the spread angle θ (θ<φ). For this reason, when the light diffusion member 30 is used, the area of the irradiated face that is irradiated by the light emitted by the light source 20 is enlarged compared to the case of not using the light diffusion member 30. The spread angles θ and φ are each the full width at half maximum (FWHM).

Herein, the planar shape of the light diffusion member 30 is rectangular. Additionally, the thickness (thickness in the z direction) td of the light diffusion member 30 is from 0.1 mm to 1 mm. Note that the planar shape of the light diffusion member 30 may also be another shape, such as polygonal or circular.

As described above, light emitted by the light source 20 is incident on the light diffusion member 30, and the incident light is diffused and emitted. Consequently, the light emitted by the light source 20 is diffused by the light diffusion member 30 before irradiating the object of measurement. In other words, the light emitted by the light source 20 and diffused by the light diffusion member 30 irradiates a wider range compared to the case where the light diffusion member 30 is not provided.

(Light Source 20)

Figure 5:
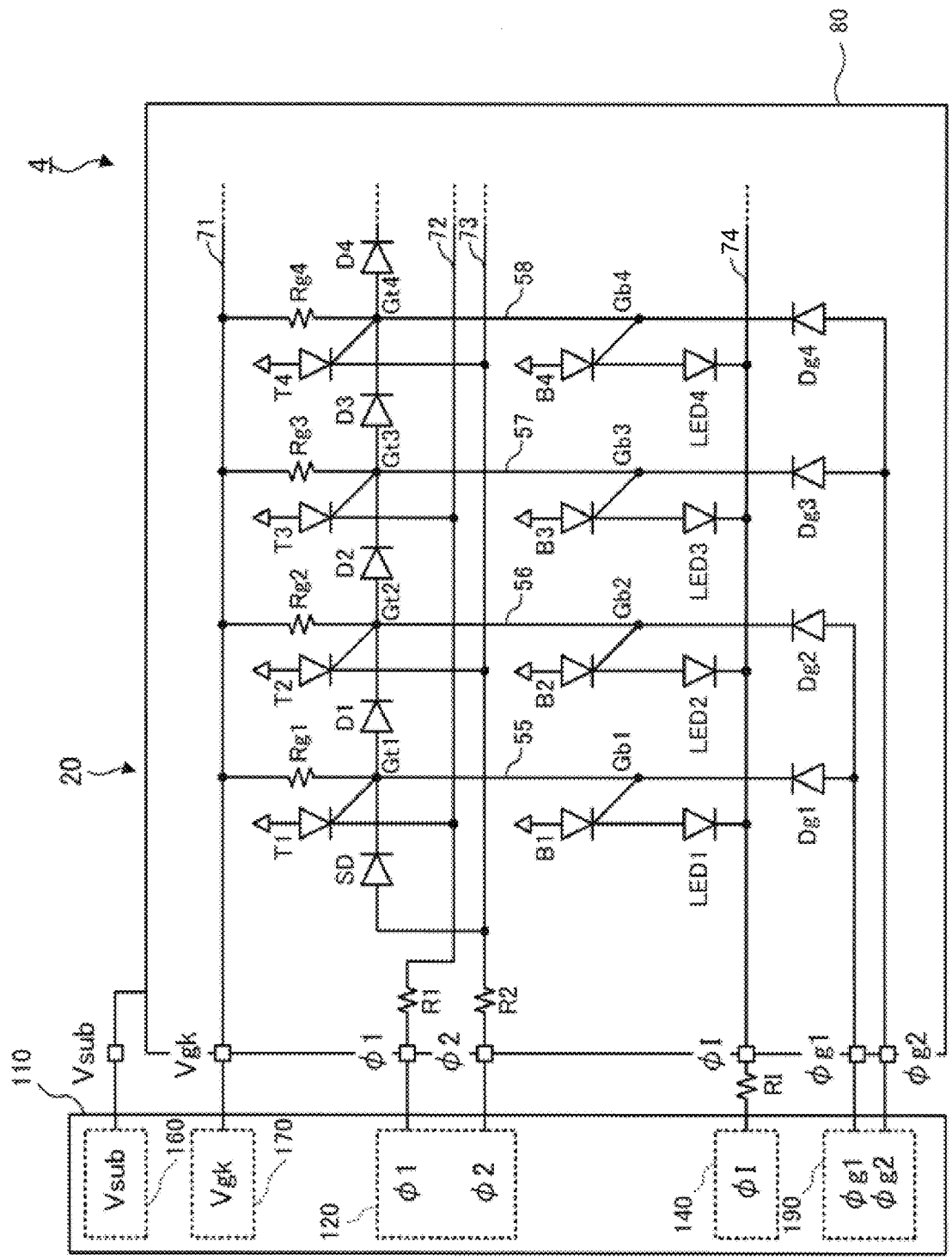
FIG. 5 is an equivalent circuit of a light source applying a first exemplary embodiment.

FIG. 5 is an equivalent circuit of the light source 20 applying the first exemplary embodiment. Note that in FIG. 5, the controller 110 is also illustrated.

The light source 20 is provided with light-emitting diodes LED1, LED2, LED3, and so on (hereinafter referred to as the light-emitting diodes LED when not being distinguished individually) and driving thyristors B1, B2, B3, and so on (hereinafter referred to as the driving thyristors B when not being distinguished individually). A light-emitting diode LED and a driving thyristor B having the same numeral are connected in series. The light-emitting diodes LED are an example of light-emitting elements. The driving thyristors B are an example of driving elements. Note that instead of the light-emitting diodes LED, laser elements such as vertical-cavity surface-emitting lasers (VCSELs) may be used, for example.

The light source 20 is also provided with transfer thyristors T1, T2, T3, and so on (hereinafter referred to as the transfer thyristors T when not being distinguished individually) arrayed in columns similarly to the light-emitting diodes LED and the driving thyristors B. Note that although the transfer thyristors T are used as an example of transfer elements in this description, other circuit elements may also be used insofar as the elements are turned on successively, and for example, circuit elements combining a shift register and multiple transistors may also be used.

Additionally, the light source 20 is provided with coupled diodes D1, D2, D3, and so on (hereinafter referred to as the coupled diodes D when not being distinguished individually) respectively paired with the transfer thyristors T in numerical order. Furthermore, the light source 20 is provided with power supply line resistors Rg1, Rg2, Rg3, and so on (hereinafter referred to as the power supply line resistors Rg when not being distinguished individually).

In addition, the light source 20 is provided with a single start diode SD. The light source 20 is also provided with current-limiting resistors R1 and R2, which are provided to keep excessive current from flowing on a transfer signal line 72 supplied with a transfer signal φ1 and a transfer signal line 73 supplied with a transfer signal φ2 described later.

Furthermore, the light source 20 is provided with simultaneous lighting diodes Dg1, Dg2, Dg3, and so on (hereinafter referred to as the simultaneous lighting diodes Dg when not being distinguished individually) for causing several of the multiple light-emitting diodes LED to light up simultaneously in parallel. The simultaneous lighting diodes Dg will be described in detail later.

The light-emitting diodes LED, the driving thyristors B, and the transfer thyristors T are arrayed in numerical order from the left side in FIG. 5. Additionally, the coupled diodes D and the power supply line resistors Rg are also arrayed in numerical order from the left side of the diagram.

In the first exemplary embodiment, it is sufficient to set the number of light-emitting diodes LED, driving thyristors B, transfer thyristors T, and power supply line resistors Rg to a predetermined number. Note that the number of coupled diodes D is one less than the number of transfer thyristors T. Also, the number of transfer thyristors T may be greater than the number of light-emitting diodes LED.

The above light-emitting diodes LED are two-terminal semiconductor elements having an anode terminal (anode) and a cathode terminal (cathode), while the thyristors (driving thyristors B and transfer thyristors T) are three-terminal semiconductor elements having an anode terminal (anode), a gate terminal (gate), and a cathode terminal (cathode), and the coupled diodes D and the start diode SD are two-terminal semiconductor elements having an anode terminal (anode) and a cathode terminal (cathode). Hereinafter, the above terminals will be referenced by the terms in parentheses, and "terminal" will be omitted.

The light-emitting diodes LED, the driving thyristors B, the transfer thyristors T, the coupled diodes D, the power supply line resistors Rg, the start diode SD, and the simultaneous lighting diodes Dg are configured as an integrated circuit by a semiconductor stack formed by epitaxial growth on a common semiconductor substrate (hereinafter referred to as the substrate 80). Here, the semiconductor stack is formed using a III-V compound semiconductor such as GaAs, GaAlAs, or AlAs, for example.

Next, the electrical connections of each element in the light source 20 will be described.

The anode of each transfer thyristor T and driving thyristor B is connected to the substrate 80 (anode common).

Additionally, these anodes are supplied with a reference potential Vsub through a back electrode, which is a Vsub terminal provided on the back of the substrate 80. Note that this connection is a configuration when using a p-type substrate 80, and in the case of using an n-type substrate, the polarity is reversed. In the case of using an intrinsic (i) substrate that is not doped with impurities, the terminal that supplies the reference potential Vsub is provided on the side where the light-emitting diodes LED and the like are provided on the substrate.

The cathodes of the odd-numbered transfer thyristors T1, T3, and so on along the array of the transfer thyristors T are connected to the transfer signal line 72. Additionally, the transfer signal line 72 is connected to a φ1 terminal through the current-limiting resistor R1. The φ1 terminal is supplied with the transfer signal φ1 from a transfer signal generation unit 120 of the controller 110.

On the other hand, the cathodes of the even-numbered transfer thyristors T2, T4, and so on along the array of the transfer thyristors T are connected to the transfer signal line 73. Additionally, the transfer signal line 73 is connected to a φ2 terminal through the current-limiting resistor R2. The φ2 terminal is supplied with the transfer signal φ2 from the transfer signal generation unit 120 of the controller 110.

The cathodes of the light-emitting diodes LED are connected to a lighting signal line 74. The lighting signal line 74 is connected to a φI terminal. The φI terminal is supplied with a lighting signal φI from a lighting signal generation unit 140 of the controller 110. The lighting signal φI supplies a current for lighting the light-emitting diodes LED.

Respective gates Gt1, Gt2, Gt3, and so on (hereinafter referred to as the gates Gt when not being distinguished individually) of the transfer thyristors T1, T2, T3, and so on are connected to respective gates Gb1, Gb2, Gb3, and so on (hereinafter referred to as the gates Gb when not being distinguished individually) of the driving thyristors B1, B2, B3, and so on having the same numeral in a 1:1 relationship. Therefore, the gates Gt and the gates Gb of the same numeral have the same electrical potential. For this reason, these gates will be referred to as the gate Gt1/Gb1 for example to indicate that the potential is the same. Additionally, the wiring leading from a power supply potential line 71 to the gate Gb1 through the power supply line resistor Rg1 and the gate Gt1 is taken to be a gate signal line 55. The wiring leading from the power supply potential line 71 to the gate Gb2 through the power supply line resistor Rg2 and the gate Gt2 is taken to be a gate signal line 56. The wiring leading from the power supply potential line 71 to the gate Gb3 through the power supply line resistor Rg3 and the gate Gt3 is taken to be a gate signal line 57. The wiring leading from the power supply potential line 71 to the gate Gb4 through the power supply line resistor Rg4 and the gate Gt4 is taken to be a gate signal line 58. The power supply potential line 71 is an example of a power supply line, while the gate signal lines 55 to 58 are an example of driving signal lines, and the potentials set on the gate signal lines 55 to 58 are an example of driving signals. Note that the gate signal lines 55 to 58 will be referred to as the gate signal lines when not being distinguished individually.

The coupled diodes D are connected respectively between each pair of gates Gt of the transfer thyristors T in numerical order. For example, the coupled diode D1 is provided between the gate Gt1 and the gate Gt2. Additionally, the coupled diode D1 is connected in the direction such that current flows from the gate Gt1 to the gate Gt2. The same applies to the other coupled diodes D.

The gates Gt/Gb of the transfer thyristors T are connected to the power supply potential line 71 through the power supply line resistors Rg provided in correspondence with each of the transfer thyristors T. The power supply potential line 71 is connected to a Vgk terminal. The Vgk terminal is supplied with a power supply potential Vgk from a power supply potential supply unit 170 of the controller 110.

Additionally, the gate Gt1 of the transfer thyristor T1 is connected to the cathode of the start diode SD. On the other hand, the anode of the start diode SD is connected to the transfer signal line 73.

Furthermore, the cathodes of the simultaneous lighting diodes Dg are connected to the gates Gb of the driving thyristors B. Additionally, the anodes of the simultaneous lighting diodes Dg1 and Dg2 are respectively connected to the gates Gb1 and Gb2 of the driving thyristors B1 and B2. The anodes of the simultaneous lighting diodes Dg1 and Dg2 are connected to a φg1 terminal. The φg1 terminal is supplied with a simultaneous lighting signal φg1 from a simultaneous lighting signal generation unit 190 of the controller 110. The anodes of the simultaneous lighting diodes Dg3 and Dg4 are respectively connected to the gates Gb3 and Gb4 of the driving thyristors B3 and B4. The anodes of the simultaneous lighting diodes Dg3 and Dg4 are connected to a φg2 terminal. The φg2 terminal is supplied with a simultaneous lighting signal φg2 from the simultaneous lighting signal generation unit 190 of the controller 110. The simultaneous lighting signals φg1 and φg2 will be referred to as the simultaneous lighting signals φg when not being distinguished individually.

The simultaneous lighting diodes Dg are provided with respect to the light-emitting diodes LED made to emit light simultaneously in parallel, and the anodes of the simultaneous lighting diodes Dg are connected to each other such that the simultaneous lighting signals φg are supplied in common to groups of the driving thyristors B of the light-emitting diodes LED made to emit light simultaneously in parallel. In FIG. 5, the light-emitting diodes LED1 and LED2 are grouped to emit light simultaneously, and the light-emitting diodes LED3 and LED4 are grouped to emit light simultaneously. Note that in the case of causing the light-emitting diodes LED1, LED2, and LED3 to emit light simultaneously, it is sufficient to connect the anodes of the simultaneous lighting diodes Dg1, Dg2, and Dg3 to each other such that the same simultaneous lighting signal φg is supplied. Also, even for light-emitting diodes LED that are not adjacent to each other in the array of the light-emitting diodes LED, like the light-emitting diodes LED1 and LED3, it is sufficient to connect the anodes of the simultaneous lighting diodes Dg connected to the driving thyristors B to each other such that a common simultaneous lighting signal φg is supplied. Additionally, the simultaneous lighting diodes Dg do not have to be provided with respect to light-emitting diodes LED that are not made to emit light simultaneously in parallel. The same applies to the other exemplary embodiment.

The operation of the simultaneous lighting diodes Dg will be described in detail later.

(Controller 110)

The controller 110 is provided with a transfer signal generation unit 120, a lighting signal generation unit 140, a reference potential supply unit 160, a power supply potential supply unit 170, and a simultaneous lighting signal generation unit 190. The transfer signal generation unit 120 generates the transfer signals φ1 and φ2 that transfers the ON state to the transfer thyristors T successively. The lighting signal generation unit 140 generates the lighting signal φI that supplies the current for lighting up the light-emitting diodes LED (that is, causing the light-emitting diodes LED to emit light). The simultaneous lighting signal generation unit 190 generates the simultaneous lighting signals φg that cause the light-emitting diodes LED to emit light simultaneously in parallel. The reference potential supply unit 160 supplies the reference potential Vsub. The power supply potential supply unit 170 supplies the power supply potential Vgk.

(Thyristors)

The basic operations of the thyristors (transfer thyristors T and driving thyristors B) will be described. As described above, the thyristors are three-terminal semiconductor elements having an anode, a cathode, and a gate, and are formed having a pnpn structure. For example, the thyristors are formed by stacking p-type semiconductor layers and n-type semiconductor layers such as GaAs, GaAlAs, or AlAs onto the substrate 80. Herein, an example will be described in which a forward potential (diffusion potential) Vd of the pn junction formed between the p-type semiconductor layers and the n-type semiconductor layers is 1.5 V.

As an example, the following description describes a case where the reference potential Vsub supplied to the Vsub terminal (back electrode) is treated as a high-level potential (hereinafter referred to as "H") of 0 V, and the power supply potential Vgk supplied to the Vgk terminal is treated as a low-level potential (hereinafter referred to as "L") of −3.3 V. Note that in addition to potential, the above may also be referred to as "H" (0 V) and "L" (−3.3 V).

The anode of each thyristor is at the reference potential Vsub ("H" (0 V)). When a potential lower than a threshold voltage (a negative potential having a large absolute value) is applied to the cathode of a thyristor in the OFF state, the thyristor is switched to the ON state (turns on). Note that the OFF state refers to a state in which a smaller current flows between the anode and the cathode compared to the ON state. Here, the threshold voltage of a thyristor is the value obtained by subtracting the forward potential Vd (1.5 V) of the pn junction from the gate potential.

When switched to the ON state, the gate of a thyristor goes to a potential close to the anode potential. Here, because the anode is set to the reference potential Vsub ("H" (0 V)), the gate goes to 0 V ("H"). Also, the cathode of a thyristor in the ON state goes to a potential close to the potential obtained by subtracting the forward potential Vd (1.5 V) of the pn junction from the anode potential. Here, because the anode is set to the reference potential Vsub ("H" (0 V)), the cathode of a thyristor in the ON state goes to a potential close to −1.5 V (a negative potential having an absolute value larger than 1.5 V). Note that the cathode potential is set by the relationship with the power supply that supplies current to the thyristor in the ON state.

When the cathode of a thyristor in the ON state goes to a higher potential (a negative potential having a small absolute value, a potential of 0 V, or a positive potential) than the potential sufficient to maintain the ON state (the above potential close to −1.5 V), the thyristor is switched to the OFF state (turns off). On the other hand, if a lower potential (a negative potential having a large absolute value) than the potential sufficient to maintain the ON state is continually supplied to the cathode of a thyristor in the ON state and a current (maintenance current) sufficient to maintain the ON state is supplied, the thyristor remains in the ON state.

(Layered Structure of Driving Thyristors B and Light-Emitting Diodes LED)

The driving thyristors B and the light-emitting diodes LED may also be configured by stacking the light-emitting diodes LED on top of the driving thyristors B provided on the substrate 80. In this case, as FIG. 5 demonstrates, if the driving thyristors B and the light-emitting diodes LED are stacked directly onto each other, the cathodes of the driving thyristors B and the anodes of the light-emitting diodes LED will be reversed biased relative to each other. Accordingly, the driving thyristors B and the light-emitting diodes LED are stacked with a tunnel junction (diode) layer in between. The tunnel junction layer is the junction of an $n^{++}$ layer doped with a high concentration of n-type impurities and a $p^{++}$ layer doped with a high concentration of p-type impurities. Consequently, the tunnel junction layer allows current to flow easily by electron tunneling, even in a reversed biased state. Therefore, when the driving thyristors B are switched to the ON state, current flows between the driving thyristors B and the light-emitting diodes LED through the reverse biased tunnel junction layer. With this arrangement, the light-emitting diodes LED emit light (light up).

Note that instead of a tunnel junction layer, a III-V compound layer having metallic conductivity formed by epitaxial growth on a III-V compound semiconductor layer may also be used. Taking InNAs as an example of a material with a III-V compound layer having metallic conductivity, the band gap energy goes negative when the composition ratio x of InN is in the range from approximately 0.1 to approximately 0.8 for example. Also, for InNSb, the band gap energy goes negative when the composition ratio x of InN is in the range from approximately 0.2 to approximately 0.75 for example. The band gap energy going negative means that the band gap does not exist. Therefore, electrical conduction properties (conductivity properties) similar to metals is exhibited. In other words, metallic conduction properties (conductivity) refer to current flowing if there is a potential gradient similar to metal.

The driving thyristors B and the light-emitting diodes LED are stacked and connected in series. Consequently, a voltage applied to the cathode of the driving thyristors B is the voltage obtained by dividing the potential of the lighting signal φI between the driving thyristors B and the light-emitting diodes LED. Herein, the rising voltage of the light-emitting diodes LED is taken to be 1.5 V, and −3.3 V is described as being applied to the driving thyristors B. Therefore, the lighting signal φI applied when lighting up the light-emitting diodes LED ("Lo" described later) is taken to be −5 V.

Note that the voltage to apply to the light-emitting diodes LED is varied depending on the emission wavelength and intensity, but in such cases, it is sufficient to adjust the voltage ("Lo") of the lighting signal φI.

(Successive Lighting Operation in Light-Emitting Device 4)

Next, an operation of causing the light-emitting diodes LED of the light source 20 to emit light successively in the light-emitting device 4 applying the first exemplary embodiment will be described.

Figure 6:
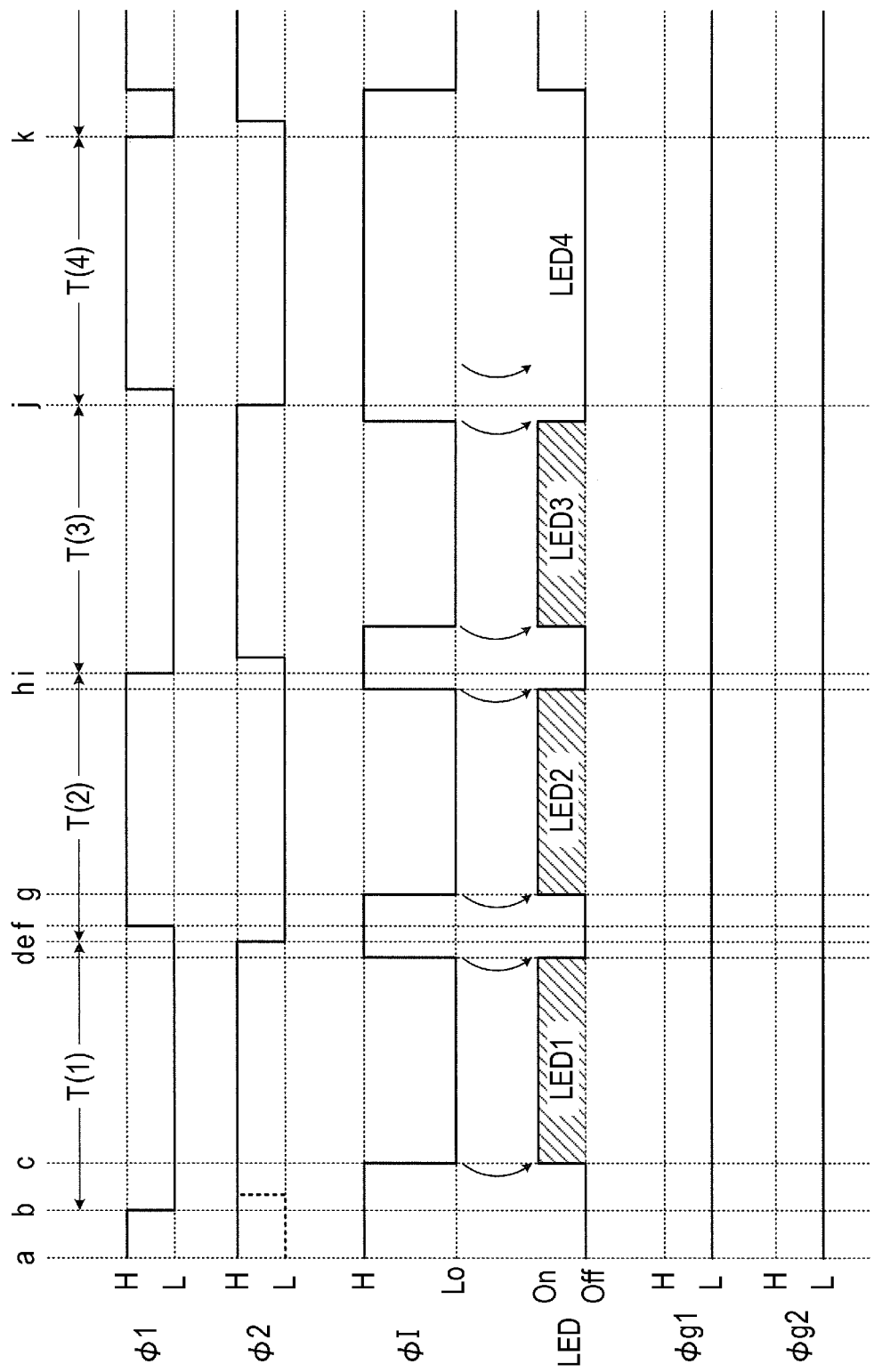
FIG. 6 is a timing chart for explaining an operation of causing light-emitting diodes to emit light successively in a light source applying the first exemplary embodiment.

FIG. 6 is a timing chart for explaining an operation of causing the light-emitting diodes LED to emit light successively in the light source 20 applying the first exemplary embodiment. FIG. 6 is a timing chart of a portion that controls the lighted (emitting) and unlighted (non-emitting) states of the four light-emitting diodes LED1 to LED4 (hereinafter referred to as lighting control). Note that in FIG. 6, the light-emitting diodes LED1, LED2, and LED3 are made to emit light, while the light-emitting diode LED4 is not made to emit light.

In this specification, "x to y" indicates the multiple structural elements distinguished by the each of the numerals from x to y, and includes the numeral x, the numeral y, and all of the numerals between x and y. For example, the "light-emitting diodes LED1 to LED4" includes the light-emitting diodes from LED1 to LED4 in numerical order.

In FIG. 6, time is assumed to elapse from a time a to a time k in alphabetical order. Control of the emitting or non-emitting state of the light-emitting diodes LED1, LED2, LED3, and LED4 (emission control) is controlled during periods T(1), T(2), T(3), and T(4), respectively.

The transfer signal φ1 supplied to the φ1 terminal (see FIG. 5) and the transfer signal φ2 supplied to the φ2 terminal (see FIGS. 5 and 6) are signals having the two potentials of "H" (0 V) and "L" (−3.3 V). Additionally, the waveforms of the transfer signal φ1 and the transfer signal φ2 repeat in units of two consecutive periods T (for example, the period T(1) and the period T(2)).

Hereinafter, "H" (0 V) and "L" (−3.3 V) may be abbreviated to "H" and "L" in some cases.

The transfer signal φ1 goes from "H" (0 V) to "L" (−3.3 V) at the start time b of the period T(1), and goes from "L" to "H" at the time f. Additionally, the transfer signal φ1 goes from "H" to "L" at the end time i of the period T(2).

The transfer signal φ2 is "H" (0 V) at the start time b of the period T(1), and goes from "H" (0 V) to "L" (−3.3 V) at the time e. Additionally, the transfer signal φ2 goes from "L" to "H" after the end time i of the period T(2).

A comparison of the transfer signal φ1 and the transfer signal φ2 reveals that the transfer signal φ2 corresponds to a displacement of the transfer signal φ1 by one period T backward on the time axis. On the other hand, for the transfer signal φ2, the waveform indicated by the dashed line in the period T(1) and the waveform in the period T(2) repeat from the period T(3). The waveform of the transfer signal φ2 in the period T(1) is different than the waveform from the period T(3) because the period T(1) is the period in which the light-emitting device 4 starts operating.

As described later, the transfer signal φ1 and the transfer signal φ2 cause the ON state of the transfer thyristors T to be transferred in numerical order, and thereby specify the light-emitting diode LED of the same numeral as the transfer thyristor T in the ON state as the target whose lighted or unlighted state is to be controlled (lighting control).

Next, the lighting signal φI supplied to the φI terminal (see FIG. 5) will be described. The lighting signal φI is a signal having the two potentials of "H" (0 V) and "Lo" (−5 V).

Here, the lighting signal φI will be described in the period T(1) of the lighting control for the light-emitting diode LED1. The lighting signal φI is "H" (0 V) at the start time b of the period T(1), and goes from "H" (0 V) to "Lo" (−5 V) at the time c. Additionally, the lighting signal φI goes from "Lo" to "H" at the time d, and maintains "H" at the time e.

The simultaneous lighting signals φg1 and φg2 supplied to the φg1 and φg2 terminals (see FIG. 5) are kept at "L" (−3.3 V).

The operation by the light-emitting device 4 will be described by following the timing chart illustrated in FIG. 6, while also referencing FIG. 5. Note that the following describes the periods T(1) and T(2) of the lighting control for the light-emitting diodes LED1 and LED2.

(1) Time A

At the time a, the reference potential supply unit 160 of the controller 110 of the light-emitting device 4 sets the reference potential Vsub to "H" (0 V). the power supply potential supply unit 170 sets the power supply potential Vgk to "L" (−3.3 V). The transfer signal generation unit 120 of the controller 110 sets each of the transfer signal φ1 and the transfer signal φ2 to "H" (0 V). With this arrangement, the φ1 terminal and the φ2 terminal of the light source 20 go to "H". The potential of the transfer signal line 72 connected to the φ1 terminal through the current-limiting resistor R1 also goes to "H", and the potential of the transfer signal line 73 connected to the φ2 terminal through the current-limiting resistor R2 also goes to "H" (see FIG. 5).

Additionally, the lighting signal generation unit 140 of the controller 110 sets the lighting signal φI to "H" (0 V). With this arrangement, the φI terminal of the light source 20 goes to "H" through a current-limiting resistor RI, and the lighting signal line 74 connected to the φI terminal also goes to "H" (0 V) (see FIG. 5).

Furthermore, the simultaneous lighting signal generation unit 190 of the controller 110 sets the simultaneous lighting signals φg1 and φg2 to "L" (−3.3 V).

The anodes of the transfer thyristors T and the driving thyristors B are connected to the Vsub terminal, and therefore are set to "H". The cathode of each of the odd-numbered transfer thyristors T1, T3, and so on is connected to the transfer signal line 72, and is set to "H" (0 V). The cathode of each of the even-numbered transfer thyristors T2, T4, and so on is connected to the transfer signal line 73, and is set to "H". Consequently, because the anode and the cathode are both at "H", the transfer thyristors T are in the OFF state.

The cathodes of the light-emitting diodes LED are connected to the lighting signal line 74 at "H" (0 V). In other words, the light-emitting diodes LED and the driving thyristors B are connected in series through the tunnel junction layer. Because the cathodes of the light-emitting diodes LED are at "H" and the anodes of the driving thyristors B are at "H", the light-emitting diodes LED and the driving thyristors B are in the OFF state.

As described above, the gate Gt1 is connected to the cathode of the start diode SD. The gate Gt1 is connected to the power supply potential line 71 of the power supply potential Vgk ("L" (−3.3 V)) through the power supply line resistor Rg1. Additionally, the anode of the start diode SD is connected to the transfer signal line 73, and is connected to the φ2 terminal at "H" (0 V) through the current-limiting resistor R2. Consequently, the start diode SD is forward biased, and the cathode of the start diode SD (the gate Gt1) goes to the voltage value (−1.5 V) obtained by subtracting the forward potential Vd (1.5 V) of the pn junction from the anode potential ("H" (0 V)) of the start diode SD. Also, when the gate Gt1 goes to −1.5 V, the coupled diode D1 is forward biased because the anode is at −1.5 V and the cathode is connected to the power supply potential line 71 ("L" (−3.3 V)) through the power supply line resistor Rg2. Consequently, the potential of the gate Gt2 goes to −3 V, which is the potential obtained by subtracting the forward potential Vd (1.5 V) of the pn junction from the potential of the gate Gt1 (−1.5 V). However, the gates Gt numbered 3 and higher are not influenced by the anode of the start diode SD being at "H" (0 V), and the potential of these gates Gt is "L" (−3.3 V), the potential of the power supply potential line 71.

Because the gates Gt are the gates Gb, the potential of the gates Gb is the same as the potential of the gates Gt. Because the simultaneous lighting signals φg1 and φg2 are "L" (−3.3 V), even if the gates Gb are at a higher potential (a negative potential having an absolute value smaller than 3.3 V) than "L" (−3.3 V) for example, the simultaneous lighting diodes Dg are in a state with a potential applied in the direction in which current does not flow easily (reverse biased). Consequently, the simultaneous lighting signals φg1 and φg2 being "L" (−3.3 V) does not influence the gates Gb. Hereinafter, a description of the simultaneous lighting signals φg1 and φg2 will be omitted.

Consequently, the threshold voltage of the transfer thyristors T and the driving thyristors B is the value obtained by subtracting the forward potential Vd (1.5 V) of the pn junction from the potential of the gates Gt and Gb. In other words, the threshold voltage of the transfer thyristor T1 and the driving thyristor B1 is −3 V, the threshold voltage of the transfer thyristor T2 and the driving thyristor B2 is −4.5 V, and the threshold voltage of the transfer thyristors T and the driving thyristors B numbered 3 and higher is −4.8 V.

(2) Time B

At the time b illustrated in FIG. 6, the transfer signal φ1 goes from "H" (0 V) to "L" (−3.3 V). This causes the light-emitting device 4 to start operating.

When the transfer signal φ1 goes from "H" to "L", the potential of the transfer signal line 72 goes from "H" (0 V) to "L" (−3.3 V) through the φ1 terminal and the current-limiting resistor R1. This causes the transfer thyristor T1 having a threshold voltage of −3 V to turn on. However, the odd-numbered transfer thyristors T numbered 3 and higher whose cathodes are connected to the transfer signal line 72 have a threshold voltage of −4.8 V, and therefore do not turn on. On the other hand, because the transfer signal φ2 is "H" (0 V) and the transfer signal line 73 is "H" (0 V), the even-numbered transfer thyristors T do not turn on.

By turning on the transfer thyristor T1, the potential of the transfer signal line 72 goes to −1.5 V obtained by subtracting the forward potential Vd (1.5 V) of the pn junction from the anode potential ("H" (0 V)).

When the transfer thyristor T1 turns on, the potential of the gate Gt1/Gb1 goes to the anode potential "H" (0 V) of the transfer thyristor T1. Additionally, the potential of the gate Gt2/Gb2 goes to −1.5 V, the potential of the gate Gt3/Gb3 goes to −3 V, and the potential of the gates Gt/Gb numbered 4 and higher goes to "L".

With this arrangement, the threshold voltage of the driving thyristor B1 is −1.5 V, the threshold voltage of the transfer thyristor T2 and the driving thyristor B2 is −3 V, the threshold voltage of the transfer thyristor T3 and the driving thyristor B3 is −4.5 V, and the threshold voltage of the transfer thyristors T and the driving thyristors B numbered 4 and higher is −4.8 V.

However, because the transfer signal line 72 is at −1.5 V due to the transfer thyristor T1 in the ON state, the odd-numbered transfer thyristors T in the OFF state do not turn on. Because the transfer signal line 73 is at "H" (0 V), the even-numbered transfer thyristors T do not turn on. Because the lighting signal line 74 is at "H" (0 V), none of the light-emitting diodes LED light up.

Immediately after the time b (here referring to when a steady state is reached after a change occurs in the thyristors and the like due to a change in the signal potential at the time b), the transfer thyristor T1 is in the ON state while the other transfer thyristors T, the driving thyristors B, and the light-emitting diodes LED are in the OFF state.

(3) Time C

At the time c, the lighting signal φI goes from "H" (0 V) to "Lo" (−5 V).

When the lighting signal φI goes from "H" to "Lo", the lighting signal line 74 goes from "H" (0 V) to "Lo" (−5 V) through the current-limiting resistor RI and the φI terminal. This causes a voltage of −3.3 V in addition to the 1.7 V applied to the light-emitting diodes LED to be applied to the driving thyristor B1, thereby turning on the driving thyristor B1 having a threshold value of −1.5 V, and the light-emitting diode LED1 lights up (emits light). With this arrangement, the potential of the lighting signal line 74 goes to a potential close to −3.2 V (a negative potential having an absolute value larger than 3.2 V). Note that the driving thyristor B2 has a threshold voltage of −3 V, but because the voltage applied to the driving thyristor B2 is −1.5 V in addition to the voltages 1.7 V and −3.2 V applied to the light-emitting diodes LED, the driving thyristor B2 does not turn on.

Immediately after the time c, the transfer thyristor T1 and the driving thyristor B1 are in the ON state, and the light-emitting diode LED1 is lighted (emitting light).

(4) Time D

At the time d, the lighting signal φI goes from "Lo" (−5 V) to "H" (0 V).

When the lighting signal φI goes from "Lo" to "H", the potential of the lighting signal line 74 goes from −3.2 V to "H" through the current-limiting resistor RI and the φI terminal. This causes both the cathode of the light-emitting diode LED1 and the anode of the driving thyristor B1 to go to "H", thereby turning off the driving thyristor B and causing the light-emitting diode LED1 to go dark (become unlighted). The lighting period of the light-emitting diode LED1 is the period during which the lighting signal φI is "Lo" (−5 V), lasting from the time c when the lighting signal φI goes from "H" to "Lo" until the time d when the lighting signal φI goes from "Lo" to "H".

Immediately after the time d, the transfer thyristor T1 is in the ON state.

(5) Time E

At the time e, the transfer signal φ2 goes from "H" (0 V) to "L" (−3.3 V). At this point, the period T(1) of the lighting control for the light-emitting diode LED1 ends, and the period T(2) of the lighting control for the light-emitting diode LED2 begins.

When the transfer signal φ2 goes from "H" to "L", the potential of the transfer signal line 73 goes from "H" to "L" through the φ2 terminal. As described above, the transfer thyristor T2 has a threshold voltage of −3 V, and therefore turns on. With this arrangement, the potential of the gate Gt2/Gb2 goes to "H" (0 V), the potential of the gate Gt3/Gb3 goes to −1.5 V, and the potential of the gate Gt4/Gb4 goes to −3 V. Additionally, the potential of the gates Gt/Gb numbered 5 and higher goes to −3.3 V.

Immediately after the time e, the transfer thyristors T1 and T2 are in the ON state.

(6) Time F

At the time f, the transfer signal φ1 goes from "L" (−3.3 V) to "H" (0 V).

When the transfer signal φ1 goes from "L" to "H", the potential of the transfer signal line 72 goes from "L" to "H" through the φ1 terminal. This causes both the anode and the cathode of the transfer thyristor T1 in the ON state to go to "H", thereby turning off the transfer thyristor T1. Thereafter, the potential of the gate Gt1/Gb1 changes toward the power supply potential Vgk ("L" (−3.3 V)) of the power supply potential line 71 through the power supply line resistor Rg1. With this arrangement, the coupled diode D1 is reverse biased. Therefore, the gate Gt2/Gb2 being "H" (0 V) does not influence the gate Gt1/Gb1. In other words, for each transfer thyristor T having a gate Gt connected by a reversed biased coupled diode D, the threshold voltage becomes 4.8 V, and the transfer thyristor T no longer turns on in response to the transfer signal φ1 or the transfer signal φ2.

Immediately after the time f, the transfer thyristor T2 is in the ON state.

(7) Other

At the time g, when the lighting signal φI goes from "H" (0 V) to "Lo" (−5 V), the driving thyristor B2 turns on and the light-emitting diode LED2 lights up (emits light), similarly to the driving thyristor B1 and the light-emitting diode LED1 at the time c.

Thereafter, at the time h, when the lighting signal φI goes from "Lo" (−5 V) to "H" (0 V), the driving thyristor B2 turns off and the light-emitting diode LED2 goes dark, similarly to the driving thyristor B1 and the light-emitting diode LED1 at the time d.

Furthermore, at the time i, when the transfer signal φ1 goes from "H" (0 V) to "L" (−3.3 V), the transfer thyristor T3 having a threshold voltage of −3 V turns on, similarly to the transfer thyristor T1 at the time b or the transfer thyristor T2 at the time e. At the time i, the period T(2) of the lighting control for the light-emitting diode LED2 ends, and the period T(3) of the lighting control for the light-emitting diode LED3 begins.

Thereafter, the operations described above are repeated.

Note that when causing the light-emitting diodes LED to remain dark (unlighted) without lighting up (emitting light), it is sufficient to keep the lighting signal φI at "H" (0 V), like the lighting signal φI illustrating from the time j to the time k in the period T(4) of the lighting control for the light-emitting diode LED4 in FIG. 6. With this arrangement, even if the threshold voltage of the driving thyristor B4 is −1.5 V, the driving thyristor B4 does not turn on, and the light-emitting diode LED4 remains dark (unlighted).

As described above, the gates Gt of the transfer thyristors T are interconnected by the coupled diodes D. Consequently, when the potential of one of the gates Gt changes, the potentials of the gates Gt connected to the gate Gt with the changed potential through the forward biased coupled diodes D also change. Additionally, the threshold voltages of the transfer thyristors T including a gate with a changed potential also change. If the threshold voltage of a transfer thyristor T is higher than "L" (−3.3 V) (that is, if the threshold voltage is a negative value having a smaller absolute value), the transfer thyristor T turns on at the timing when the transfer signal φ1 or the transfer signal φ2 goes from "H" (0 V) to "L" (−3.3 V).

Additionally, because a driving thyristor B whose gate Gb is connected to the gate Gt of a transfer thyristor t in the ON state has a threshold voltage of 1.5 V, the driving thyristor B turns on when the lighting signal φI goes from "H" (0 V) to "Lo" (−5 V), and the light-emitting diode LED connected in series to the driving thyristor B lights up (emits light).

In other words, when the potential of the gate Gb (a gate signal line such as the gate signal line 55) of each driving thyristor B goes to −1.5 V, each driving thyristor B is in a ready state to switch to the ON state. Thereafter, if the lighting signal φI goes from "H" (0 V) to "Lo" (−5 V), the driving thyristor B is switched to the ON state, and the light-emitting diode LED lights up (emits light). In other words, by switching the driving thyristor B to the ON state, the driving thyristor B drives the light-emitting diode LED to light up.

That is to say, switching one of the transfer thyristors T to the ON state specifies which light-emitting diode LED is the target of the lighting control, and the lighting signal φI at "Lo" (−5 V) turns on the driving thyristor B connected in series to the light-emitting diode LED specified as the target of the lighting control and also causes the light-emitting diode LED to light up. In other words, by transferring the ON state of the transfer thyristors T, the light-emitting diodes LED light up successively. The light source 20 is a self-scanning light-emitting device (SLED).

Note that the lighting signal φI at "H" (0 V) keeps the driving thyristors B in the OFF state and also keeps the light-emitting diodes LED in the unlighted state. In other words, the lighting signal φI sets the lighted/unlighted state of the light-emitting diodes LED.

(Full Simultaneous Lighting Operation by Light Source 20 in Light-Emitting Device 4)

In the light source 20, there is a demand to cause all of the multiple light-emitting diodes LED to light up simultaneously in parallel. "Simultaneously" means that a lighting operation is performed for all of the light-emitting diodes LED at a single signal timing. Additionally, the operation of causing all light-emitting diodes LED to light up simultaneously in parallel is referred to as the full simultaneous lighting operation. For example, when inspecting for the presence or absence of lighting faults in the light-emitting diodes LED or during burn-in of the light-emitting diodes LED, which are performed after manufacturing the light source 20, efficiency would be improved if it were possible to cause all of the light-emitting diodes LED in the light source 20 to light up. Burn-in refers to a method of reducing initial failure in advance by imposing a temperature and voltage load. Performing burn-in after manufacturing is particularly demanded in the case of using laser elements such as vertical-cavity surface-emitting lasers (VCSELs) instead of light-emitting diodes LED. Additionally, it is desirable to cause all of the light-emitting diodes LED to light up in the case of measuring patterns of light (a near-field pattern and a far-field pattern) emitted from the light source 20. Note that the full simultaneous lighting operation may also be referred to as the simultaneous lighting operation in some cases.

The full simultaneous lighting operation by the light source 20 will be described.

As described above, to cause one of the light-emitting diodes LED to light up, it is sufficient to turn on the corresponding driving thyristor B with the lighting signal φI. Therefore, in the full simultaneous lighting operation, the driving thyristors B connected to all of the light-emitting diodes LED are turned on with the lighting signal φI.

In the successive lighting operation by the light-emitting device 4, the power supply potential supply unit 170 of the controller 110 sets the supplied power supply potential Vgk to "L" (−3.3 V). In the full simultaneous lighting operation, the reference potential supply unit 160 of the controller 110 sets the reference potential Vsub to "H" (0 V), and the power supply potential supply unit 170 sets the power supply potential Vgk to "H" (0 V). Additionally, the lighting signal generation unit 140 sets the lighting signal φI to "Lo" (−5 V).

Thereafter, the gates Gb of the driving thyristors B go to "H" (0 V), and the threshold voltage of the driving thyristors B goes to −1.5 V. In other words, when the potential of the gate Gb (a gate signal line such as the gate signal line 55) of each driving thyristor B goes to −1.5 V, each driving thyristor B is in a ready state to switch to the ON state. Therefore, if the lighting signal φI is at "Lo" (−5 V), the driving thyristors B turn on and the light-emitting diodes LED light up (emit light), similarly to the time c in FIG. 6. In other words, all of the light-emitting diodes LED light up simultaneously in parallel. This state is not influenced by the other signals (the transfer signals φ1 and φ2 or the simultaneous lighting signals φg1 and φg2) Consequently, the potentials of the other terminals (φ1 terminal, φ2 terminal, φg1 terminal, and φg2 terminal) do not have to be set. That is, the other terminals (φ1 terminal, φ2 terminal, φg1 terminal, and φg2 terminal) may be open.

(Partial Simultaneous Lighting Operation by Light Source 20 in Light-Emitting Device 4)

In the light source 20, there is a demand to cause a portion of the multiple light-emitting diodes LED to light up as a group. This is referred to as the partial simultaneous lighting operation. In this case, the simultaneous lighting diodes Dg are used.

The partial simultaneous lighting operation by the light source 20 will be described.

As described above, to cause one of the light-emitting diodes LED to light up, it is sufficient to turn on the corresponding driving thyristor B with the lighting signal φI. Therefore, in the partial simultaneous lighting operation, the driving thyristors B connected to a group of light-emitting diodes LED are turned on with the lighting signal φI.

For example, in the case of causing the light-emitting diodes LED1 and LED2 to light up as a group simultaneously in parallel, the reference potential supply unit 160 of the controller 110 sets the reference potential Vsub to "H" (0 V), and sets the simultaneous lighting signal φg1 of the simultaneous lighting signal generation unit 190 (the simultaneous lighting signal φg1 supplied to the anodes of the simultaneous lighting diodes Dg1 and Dg2) to "H" (0 V). Additionally, the lighting signal generation unit 140 sets the lighting signal φI to "Lo" (−5 V). Thereafter, the gates Gb1 and Gb2 of the driving thyristors B1 and B2 go to −1.5 V, and the threshold voltage of the driving thyristors B1 and B2 goes to −3.0 V. In other words, when the potential of the gates Gb1 and Gb2 (gate signal lines 55 and 55) of the driving thyristors B1 and B2 goes to −1.5 V, the driving thyristors B1 and B2 are in a ready state to switch to the ON state. As described above, because −3.3 V is applied to the driving thyristors B1 and B2 in the OFF state, the driving thyristors B1 and B2 turn on. With this arrangement, the light-emitting diodes LED1 and LED2 light up.

The above describes the case of causing the light-emitting diodes LED1 and LED2 to light up as a group simultaneously in parallel, but in the case of causing the light-emitting diodes LED3 and LED4 to light up as a group simultaneously in parallel, it is sufficient to set the simultaneous lighting signal φg2 to "H" (0 V) instead of the simultaneous lighting signal φg1. Likewise, in other cases, it is sufficient to configure the light-emitting diodes LED treated as a group such that the simultaneous lighting diodes Dg provided in correspondence with the grouped light-emitting diodes LED share a common anode, and to set the simultaneous lighting signal φg set at the anode to "H" (0 V). Also, in the case of causing all of the light-emitting diodes LED to light up simultaneously in parallel, it is sufficient to provide the simultaneous lighting diodes Dg in correspondence with all of the light-emitting diodes LED, and set the simultaneous lighting signals φg such that the anodes of all of the simultaneous lighting diodes Dg go to "H" (0 V).

Note that in FIG. 5, the anodes of the simultaneous lighting diodes Dg1 and Dg2 are connected by wiring to the simultaneous lighting signal generation unit 190 of the controller 110, and the anodes of the simultaneous lighting diodes Dg3 and 4 are connected by wiring to the simultaneous lighting signal generation unit 190 of the controller 110. However, the anode of each simultaneous lighting diode Dg may also be connected to the simultaneous lighting signal generation unit 190 individually, and the simultaneous lighting signal generation unit 190 may select which light-emitting diodes LED to treat as a group.

Also, in the case of performing the successive lighting operation and the full simultaneous lighting operation, without performing the partial simultaneous lighting operation, the simultaneous lighting diodes Dg do not have to be provided. Furthermore, the simultaneous lighting signal generation unit 190 does not have to be provided in the controller 110.

As described above, by using the simultaneous lighting diodes Dg to control the potential of the simultaneous lighting signals φg, the simultaneous lighting diodes Dg are reverse biased in the successive lighting operation, and forward biased in the partial simultaneous lighting operation. This arrangement makes it easy to control the switching between the successive lighting operation and the partial simultaneous lighting operation.

Second Exemplary Embodiment

According to the light-emitting device 4 applying the first exemplary embodiment, in the successive lighting operation, light-emitting elements (in the first exemplary embodiment, the light-emitting diodes LED) light up successively, and several light-emitting elements do not light up simultaneously in parallel. According to a light-emitting device 4A applying the second exemplary embodiment, in the successive lighting operation, several light-emitting elements light up simultaneously in parallel, and in addition, the light-emitting elements are provided with gradations of intensity.

In the light-emitting device 4A applying the second exemplary embodiment, a light source 21 and a controller 111 are different from the light-emitting device 4 applying the first exemplary embodiment. Consequently, a description of similar portions will be omitted, and the different portions will be described. Note that portions having the same function are denoted with the same signs.

Figure 7:
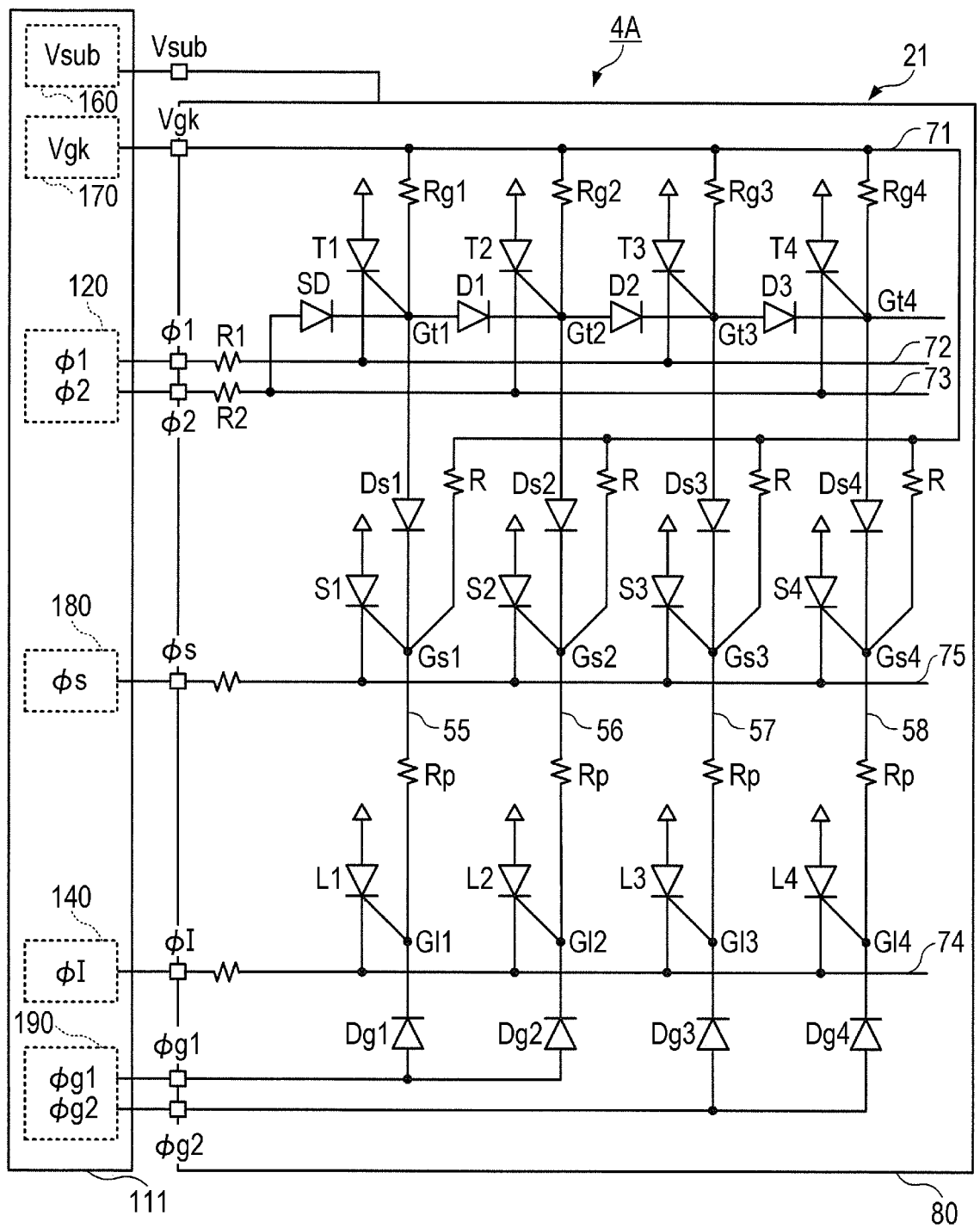
FIG. 7 is an equivalent circuit of a light source applying a second exemplary embodiment.

FIG. 7 is an equivalent circuit of the light source 21 applying the second exemplary embodiment. Note that in FIG. 7, the controller 111 is also illustrated.

The light source 21 is provided with light-emitting thyristors L1, L2, L3, and so on (hereinafter referred to as the light-emitting thyristors L when not being distinguished individually), transfer thyristors T1, T2, T3, and so on, coupled diodes D1, D2, D2, and so on, a start diode SD, setting thyristors S1, S2, S3, and so on, connecting diodes Ds1, Ds2, Ds3, and so on (hereinafter referred to as the connecting diodes Ds when not being distinguished individually), and power supply line resistors Rg1, Rg2, Rg3, and so on. The respective gates of the light-emitting thyristors L1, L2, L3, and so on are designated the gates G11, G12, G13, and so on (hereinafter referred to as the gates G1 when not being distinguished individually). Furthermore, resistors Rp that connect the gates Gs of the setting thyristors S and the gates G1 of the light-emitting thyristors L are provided.

In the second exemplary embodiment, the light-emitting thyristors L are used instead of the light-emitting diodes LED and the driving thyristors B in the first exemplary embodiment. The light-emitting thyristors L double as light-emitting elements and driving elements. In other words, the light-emitting thyristors L are an example of light-emitting elements and driving elements. Light emission occurs in thyristors at the boundary between a p-gate layer and an n-gate layer of a semiconductor stack having a pnpn structure. Consequently, thyristors may also be used as light-emitting elements.

The connecting diodes Ds are two-terminal elements provided with an anode and a cathode.

Hereinafter, the connection relationships between the elements in the light source 21 will be described. Note that a description will be omitted for portions that are similar to the light source 20 applying the first exemplary embodiment.

The gates Gt of the transfer thyristors T are connected to the anodes of the connecting diodes Ds. The cathodes of the connecting diodes Ds are connected to the gates Gs of the setting thyristors S. The gates Gs of the setting thyristors S are connected to the gates G1 of the light-emitting thyristors L through the resistors Rp. Additionally, the cathodes of the setting thyristors S are connected to a setting signal line 75. Additionally, the setting signal line 75 is connected to a φs terminal. The φs terminal is supplied with a setting signal φs from a setting signal generation unit 180 in the controller 111.

In other words, the gate Gs1 of the setting thyristor S1 and the gate G11 of the light-emitting thyristor L1 are connected by a gate signal line 55 running from the power supply potential line 71 through the power supply line resistor Rg1, the connecting diode Ds1, and the resistor Rp. The gate Gs2 of the setting thyristor S2 and the gate G12 of the light-emitting thyristor L2 are connected by a gate signal line 56 running from the power supply potential line 71 through the power supply line resistor Rg2, the connecting diode Ds2, and the resistor Rp. The gate Gs3 of the setting thyristor S3 and the gate G13 of the light-emitting thyristor L3 are connected by a gate signal line 57 running from the power supply potential line 71 through the power supply line resistor Rg3, the connecting diode Ds3, and the resistor Rp. The gate Gs4 of the setting thyristor S4 and the gate G14 of the light-emitting thyristor L4 are connected by a gate signal line 58 running from the power supply potential line 71 through the power supply line resistor Rg4, the connecting diode Ds4, and the resistor Rp.

The cathodes of the simultaneous lighting diodes Dg are connected to the gates G1 of the light-emitting thyristors L. In other words, the cathode of the simultaneous lighting diode Dg1 is connected to the gate signal line 55, and the cathode of the simultaneous lighting diode Dg2 is connected to the gate signal line 56. The anodes of the simultaneous lighting diodes Dg1 and Dg2 are connected to the φg1 terminal. The φg1 terminal is supplied with the simultaneous lighting signal φg1 from the simultaneous lighting signal generation unit 190 in the controller 111.

Also, the cathode of the simultaneous lighting diode Dg3 is connected to the gate signal line 57, and the cathode of the simultaneous lighting diode Dg4 is connected to the gate signal line 58. The anodes of the simultaneous lighting diodes Dg3 and Dg4 are connected to the φg2 terminal. The φg2 terminal is supplied with the simultaneous lighting signal φg2 from the simultaneous lighting signal generation unit 190 in the controller 111.

Compared to the controller 110 of the light-emitting device 4 applying the first exemplary embodiment, the controller 111 is further provided with a setting signal generation unit 180 that generates a setting signal φs for setting the lighted (emitting) or unlighted (non-emitting) state of the light-emitting thyristors L.

(Successive Lighting Operation in Light-Emitting Device 4A)

Next, the operation of causing the light-emitting thyristors L of the light source 21 in the light-emitting device 4A to emit light successively will be described.

First, a basic successive lighting operation in the light source 21 will be described.

The ON state of the transfer thyristors T is transferred similarly to the light source 20 of the light-emitting device 4 applying the first exemplary embodiment. Note that the lighting signal φI is at "L" (−3.3 V), and the setting signal φs is at "H" (0 V). Here, it is assumed that the transfer thyristor T1 is in the ON state. This causes the gate Gt1 to go to 0 V. Consequently, the gate Gs1 connected by the connecting diode Ds1 goes to −1.5 V. The gate Gl1 of the light-emitting thyristor L1 is connected to the gate Gs1 of the setting thyristor S1 set to −1.5 V through the resistor Rp. At this point, it is assumed that the voltage drop δ across the resistor Rp is 0.8 V. Consequently, the gate Gl1 of the light-emitting thyristor L1 goes to −2.3 V, which is the potential obtained by subtracting the voltage drop across the resistor Rp (0.8 V) from the potential of the gate Gs1 (−1.5 V). With this arrangement, the threshold voltage of the light-emitting thyristor L1 goes to −3.8 V. Consequently, even if the lighting signal φI is "L" (−3.3 V), the light-emitting thyristor L1 does not light up.

Because the gate Gs1 is at −1.5 V, the setting thyristor S1 has a threshold voltage of −3.0 V. Accordingly, when the setting signal φs goes to "L" (−3.3 V), the setting thyristor S1 turns on. This causes the gate Gs1 to go to 0 V. Consequently, the gate Gl1 goes to −0.8 V, and the threshold voltage of the light-emitting thyristor L1 goes to −2.3 V. With this arrangement, because the lighting signal φI is "L" (−3.3 V), the light-emitting thyristor L1 turns on and lights up (emits light).

In other words, when the potential of the gate Gl (a gate signal line such as the gate signal line 55) of each light-emitting thyristor L goes to −2.3 V, each light-emitting thyristor L is in a ready state to switch to the ON state.

At this time, when the setting signal φs goes to "H" (0 V), the setting thyristor S1 turns off. However, if the lighting signal φI is kept at "L" (−3.3 V), the light-emitting thyristor L1 continues to be lighted. Note that the simultaneous lighting signals φg1 and φg2 are kept at "L" (−3.3 V).

In this way, in the light source 21, if the setting thyristor S is turned on in the period during which the transfer thyristor T is in the ON state, the light-emitting thyristor L connected to the setting thyristor S through the resistor Rp lights up. Thereafter, the light-emitting thyristor L continues to be lighted in the period during which the lighting signal φI is at "L" (−3.3 V).

As described above, in the successive lighting operation in the light source 21 applying the second exemplary embodiment, the ON state of the transfer thyristors T is transferred successively to specify the light-emitting thyristors L in order as the target of the lighting control. At this time, when one of the setting thyristor S turns on (changes to the ON state), the corresponding light-emitting thyristor L lights up. In other words, the light source 21 is a self-scanning light-emitting device (SLED).

Figure 8:
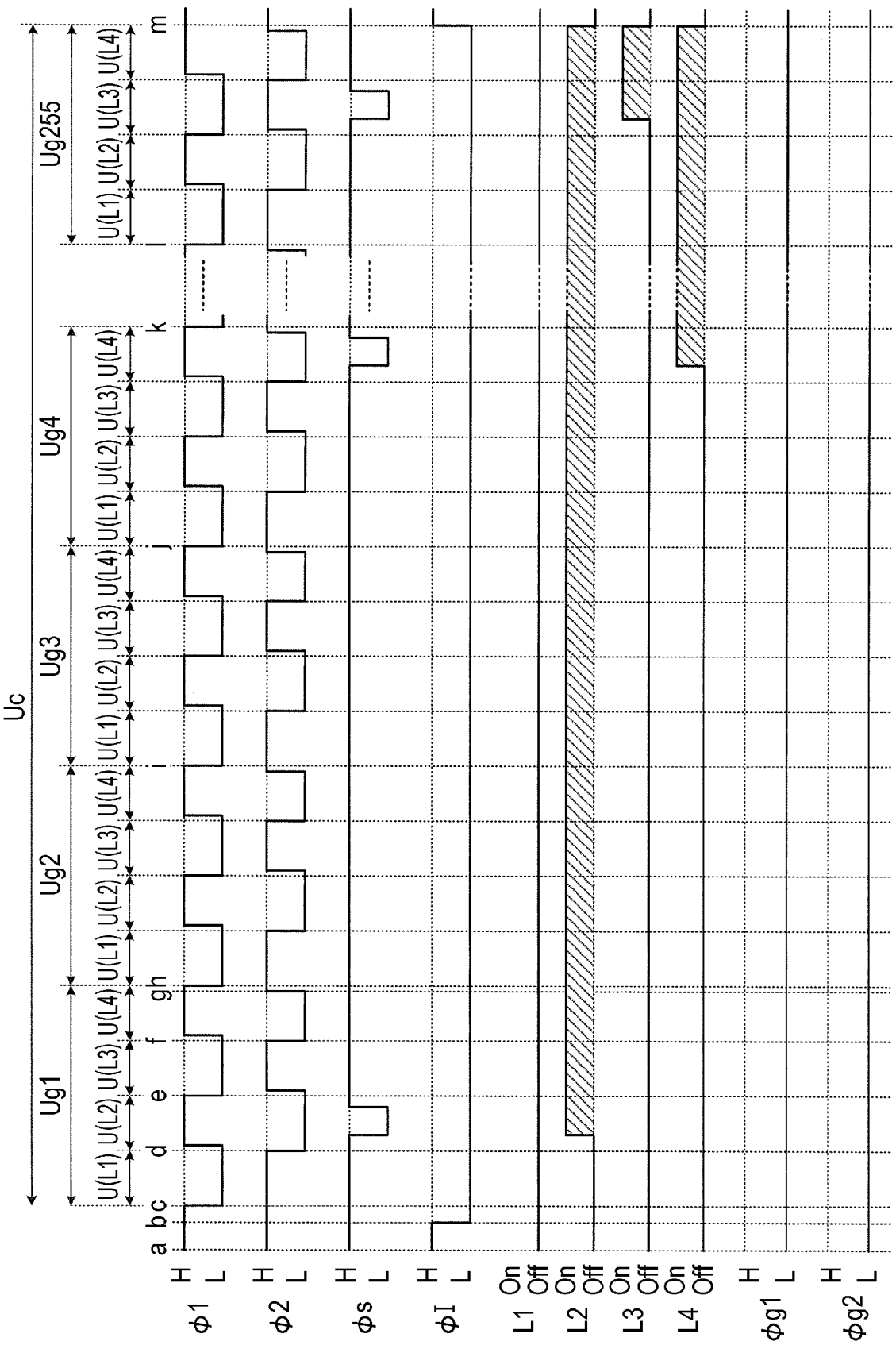
FIG. 8 is a timing chart for explaining an operation of causing light-emitting thyristors to light up successively in a light source applying the second exemplary embodiment.

FIG. 8 is a timing chart for explaining an operation of causing the light-emitting thyristors L to light up successively in the light source 21 applying the second exemplary embodiment. FIG. 8 is a timing chart of a portion that controls the lighted (emitting) and unlighted (non-emitting) states of the four light-emitting thyristors L1 to L4 (hereinafter referred to as lighting control). Time is assumed to elapse in alphabetical order (in the order of the times a, b, c, and so on). Note that the times a, b, c, and so on in FIG. 8 are different from the times a, b, c, and so on illustrated in FIG. 6.

Here, it is assumed that 256 gradations are achieved with the light-emitting thyristors L. In other words, to achieve 256 gradations, a lighting duration Uc of an ongoing lighted state is divided into 255 periods to provide gradation setting periods Ug1, Ug2, Ug3, and so on to Ug255 (hereinafter referred to as the gradation setting periods Ug when not being distinguished individually) that set the gradation. Additionally, each gradation setting period Ug is provided with periods U(L1) to U(L4) (hereinafter referred to as the periods U when not being distinguished individually) that set each of the light-emitting thyristors L1 to L4 to either the lighted or unlighted state.

The gradation setting period Ug1 is from the time c to the time h, the gradation setting period Ug2 is from the time h to the time i, the gradation setting period Ug3 is from the time i to the time j, the gradation setting period Ug4 is from the time j to the time k, and the gradation setting period Ug255 is from the time l to the time m. The other gradation setting periods Ug5 to Ug254 are provided between the gradation setting period Ug4 and the gradation setting period Ug255. The lighting duration Uc is from the time c to the time m.

Additionally, in the gradation setting period Ug1, the period U(L1) that sets the light-emitting thyristor L1 to either the lighted or unlighted state is from the time c to the time d, the period U(L2) that sets the light-emitting thyristor L2 to either the lighted or unlighted state is from the time d to the time e, the period U(L3) that sets the light-emitting thyristor L3 to either the lighted or unlighted state is from the time e to the time f, and the period U(L4) that sets the light-emitting thyristor L1 to either the lighted or unlighted state is from the time f to the time h. Note that the other gradation setting periods Ug2 to Ug255 similarly are provided with the periods U that set each of the light-emitting thyristors L1 to L4 to either the lighted or unlighted state.

Here, as an example, the light-emitting thyristor L1 is kept in the unlighted state (gradation 0). The light-emitting thyristor L2 is assumed to be in the lighted state for 255 periods among the 255 gradation setting periods Ug (gradation 255). The light-emitting thyristor L3 is assumed to be in the lighted state for 1 period among the 255 gradation setting periods Ug (gradation 1). The light-emitting thyristor L4 is assumed to be in the lighted state for 252 periods among the 255 gradation setting periods Ug (gradation 252). In other words, 256 gradations are obtained by setting each of the light-emitting thyristors L1 to L4 to either the lighted or unlighted state in any of the 255 gradation setting periods Ug. In this way, the transfer control that successively transfers the ON state of the transfer thyristors T1 to T4 is repeated a number of times corresponding to the number of gradations (for example, 256 gradations), and in addition, the gradation is controlled by causing the targeted light-emitting thyristor(s) L to emit light at the time point at which the transfer control is repeated a number of times corresponding to the desired gradation to output.

Note that if each period U that sets the light-emitting thyristors L to either the lighted or unlighted state is assumed to be 10 ns, the gradation setting period Ug is 40 ns. With this arrangement, the lighting duration Uc for achieving 256 gradations is the 40 ns of the gradation setting period Ug multiplied by 255, or 10.2 µs.

In the period U(L1) of the gradation setting period Ug1 (from the time c to the time d), the setting signal φs is kept at "H" (0 V), and therefore the light-emitting thyristor L1 is kept in the unlighted state. Next, in the period U(L2) of the gradation setting period Ug1 (from the time d to the time e), the setting signal φs is set to "L" (−3.3 V), and therefore the light-emitting thyristor L2 turns on and lights up. Additionally, the lighted state is maintained for the rest of the lighting duration Uc.

In the period U(L3) of the gradation setting period Ug1 (from the time e to the time f), the setting signal φs is kept at "H" (0 V), and therefore the light-emitting thyristor L3 is kept in the unlighted state.

In the period U(L4) of the gradation setting period Ug1 (from the time f to the time h), the setting signal φs is kept at "H" (0 V), and therefore the light-emitting thyristor L4 is kept in the unlighted state. However, at the time g of the period U(L4) of the gradation setting period Ug1, the transfer signal φ2 goes from "L" (−3.3 V) to the "H" (0 V). This causes the transfer thyristor T4 in the ON state to go to the OFF state. Consequently, at the time h, all of the transfer thyristors T1 to T4 (see FIG. 7) are in the OFF state. This is the same as the state immediately before the time c (for the transfer thyristors T, the initial state at the time a). With this arrangement, the transfer of the ON state by the transfer thyristors T returns from the transfer thyristor T4 to the transfer thyristor T1.

The subsequent gradation setting periods Ug2 to Ug255 are repetitions of the gradation setting period Ug1.

Additionally, the light-emitting thyristor L4 goes from the OFF state (unlighted state) to the ON state (lighted state) in the gradation setting period Ug4, and the light-emitting thyristor L3 goes from the OFF state (unlighted state) to the ON state (lighted state) in the gradation setting period Ug255.

Additionally, at the time m at which the gradation setting period Ug255 ends, the lighting signal φI goes from "L" (−3.3 V) to "H" (0 V), thereby causing the light-emitting thyristors L2, L3, and L4 in the lighted state to turn off and go to the unlighted state.

As described above, the light-emitting thyristor L2 is kept in the lighted state from the gradation setting period Ug1 to the gradation setting period Ug255, thereby producing the gradation 255. The light-emitting thyristor L3 is kept in the lighted state from the gradation setting period Ug4 to the gradation setting period Ug255, thereby producing the gradation 252. The light-emitting thyristor L4 is kept in the lighted state in the gradation setting period Ug255, thereby producing the gradation 1. Meanwhile, the light-emitting thyristor L1 is kept in the unlighted state from the gradation setting period Ug1 to the gradation setting period Ug255, thereby producing the gradation 0. In other words, 256 gradations are achieved.

Operations by the light source 21 not described here are similar to the operations by the light source 20 described in the first exemplary embodiment, and therefore further description is omitted.

(Full Simultaneous Lighting Operation by Light Source 21 in Light-Emitting Device 4A)

A full simultaneous lighting operation that causes all of the light-emitting thyristors L to light up simultaneously in parallel in the light source 21 will be described.

To cause one of the light-emitting thyristors L to light up, it is sufficient to turn on the light-emitting thyristor L with the lighting signal φI. Consequently, in the full simultaneous lighting operation, all of the light-emitting thyristors L are turned on with the lighting signal φI.

In the successive lighting operation by the light-emitting device 4A, the power supply potential Vgk supplied by the power supply potential supply unit 170 of the controller 111 is set to "L" (−3.3 V). In the full simultaneous lighting operation, the reference potential Vsub supplied by the reference potential supply unit 160 and the power supply potential Vgk supplied by the power supply potential supply unit 170 of the controller 111 are set to "H" (0 V). Additionally, the lighting signal φI generated by the lighting signal generation unit 140 is set to "L" (−3.3 V).

When the power supply potential Vgk is set to "H" (0 V), the gates G1 of the light-emitting thyristors L connected to the power supply potential line 71 at "H" (0 V) through the current-limiting resistors R, the connecting diode Ds, and the resistors Rp go to "H" (0 V). With this arrangement, the threshold voltage of the light-emitting thyristors L goes to −1.5 V. Consequently, if the lighting signal φI goes to "L" (−3.3 V), the light-emitting thyristors L light up (emit light). In other words, all of the light-emitting thyristors light up simultaneously in parallel. This state is not influenced by the other signals (the transfer signals φ1 and φ2, the setting signal cps, or the simultaneous lighting signals φg1 and φg2). Consequently, the potentials of the other terminals (φ1 terminal, φ2 terminal, φs terminal, φg1 terminal, and φg2 terminal) do not have to be set. That is, the other terminals (φ1 terminal, φ2 terminal, φs terminal, φg1 terminal, and φg2 terminal) may be open.

(Partial Simultaneous Lighting Operation by Light Source 21 in Light-Emitting Device 4A)

A partial simultaneous lighting operation that causes a portion of the multiple light-emitting thyristors L to light up as a group in the light source 21 will be described.

To cause one of the light-emitting thyristors L to light up, it is sufficient to turn on the light-emitting thyristor L with the lighting signal φI. Consequently, in the partial simultaneous lighting operation, the grouped light-emitting thyristors L are turned on with the lighting signal φI.

For example, in the case of causing the light-emitting thyristors L1 and L2 to light up as a group simultaneously in parallel, the reference potential supply unit 160 of the controller 111 sets the reference potential Vsub to "H" (0 V). Additionally, the simultaneous lighting signal φg1 (the simultaneous lighting signal φg1 supplied to the anode of the simultaneous lighting diodes Dg1 and Dg2) of the simultaneous lighting signal generation unit 190 is set to "H" (0 V), and the lighting signal φI of the lighting signal generation unit 140 is set to "L" (−3.3 V). When the simultaneous lighting signal φg1 is set to "H" (0 V), the threshold voltage of the light-emitting thyristors L1 and L2 goes to −1.5 V. Because "L" (−3.3 V) is applied to the light-emitting thyristors L1 and L2, the light-emitting thyristors L1 and L2 light up.

The above describes the case of causing the light-emitting thyristors L1 and L2 to light up as a group simultaneously in parallel, but in the case of causing the light-emitting thyristors L3 and L3 to light up as a group simultaneously in parallel, it is sufficient to set the simultaneous lighting signal φg2 to "H" (0 V) instead of the simultaneous lighting signal φg1. Likewise, in other cases, it is sufficient to configure the light-emitting thyristors L treated as a group such that the simultaneous lighting diodes Dg provided in correspondence with the grouped light-emitting diodes LED share a common anode, and to set the simultaneous lighting signal φg set at the anode to "H" (0 V). Also, in the case of causing all of the light-emitting thyristors L to light up simultaneously in parallel, it is sufficient to provide the simultaneous lighting diodes Dg in correspondence with all of the light-emitting thyristors L, and set the simultaneous lighting signals φg such that the anodes of all of the simultaneous lighting diodes Dg go to "H" (0 V).

Note that in FIG. 7, the anodes of the simultaneous lighting diodes Dg1 and Dg2 are connected by wiring to the simultaneous lighting signal generation unit 190 of the controller 111, and the anodes of the simultaneous lighting diodes Dg3 and 4 are connected by wiring to the simultaneous lighting signal generation unit 190 of the controller 111. However, the anode of each simultaneous lighting diode Dg may also be connected to the simultaneous lighting signal generation unit 190 individually, and the simultaneous lighting signal generation unit 190 may select which light-emitting thyristors L to treat as a group.

Also, in the case of performing the successive lighting operation and the full simultaneous lighting operation, without performing the partial simultaneous lighting operation, the simultaneous lighting diodes Dg do not have to be provided. Furthermore, the simultaneous lighting signal generation unit 190 does not have to be provided in the controller 111.

Third Exemplary Embodiment

In the light source 20 of the light-emitting device 4 applying the first exemplary embodiment and the light source 21 of the light-emitting device 4A applying the second exemplary embodiment, the light-emitting elements are arranged in a one-dimensional array. In a light source 22 of a light-emitting device 4B applying a third exemplary embodiment, the light-emitting elements are arranged in a two-dimensional array.

In the light-emitting device 4B applying the third exemplary embodiment, the light source 22 and a controller 112 are different from the light-emitting device 4 applying the first exemplary embodiment. Consequently, a description of similar portions will be omitted, and the different portions will be described. Note that portions having the same function are denoted with the same signs.

Figure 9:
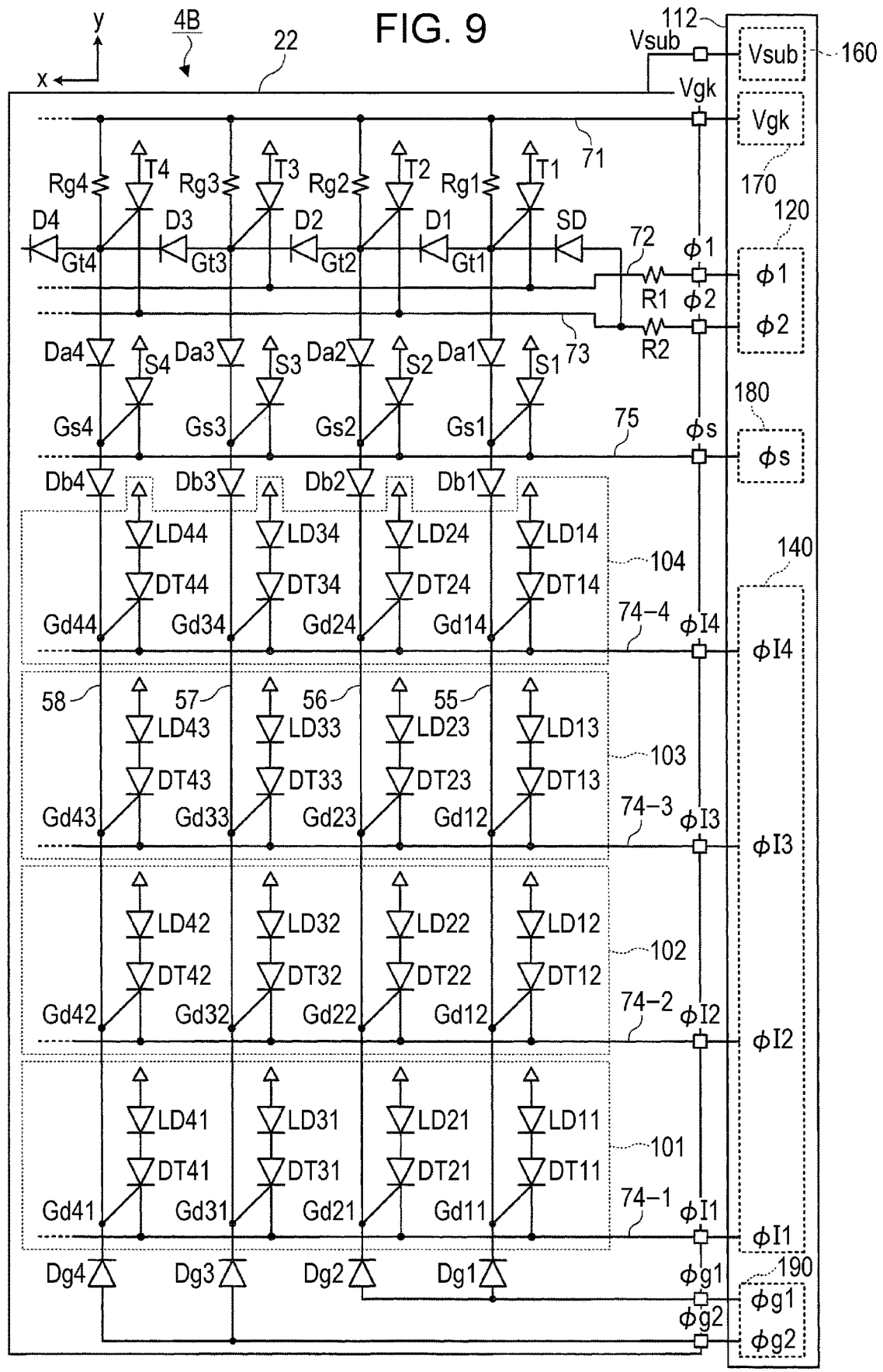
FIG. 9 is an equivalent circuit of a light source applying a third exemplary embodiment.

FIG. 9 is an equivalent circuit of the light source 22 applying the third exemplary embodiment. Note that in FIG. 9, the controller 112 is also illustrated. On the page of FIG. 9, the direction going from right to left is defined as the x direction, and the direction going from bottom to top is defined as the y direction. The x direction and the y direction are orthogonal.

The light source 22 is provided with 16 laser diodes LD arranged in a 4×4 matrix (two-dimensional array). Note that a two-dimensional array means that the arrangement has two dimensions, and refers to an arrangement extending in the x direction and the y direction, for example. In other words, the two-dimensional array is provided with a light-emitting element section 101 in which laser diodes LD11, LD21, LD31, and LD41 are arranged in the x direction, a light-emitting element section 102 in which laser diodes LD12, LD22, LD32, and LD42 are arranged in the x direction, a light-emitting element section 103 in which laser diodes LD13, LD23, LD33, and LD43 are arranged in the x direction, and a light-emitting element section 104 in which laser diodes LD14, LD24, LD34, and LD44 are arranged in the x direction.

Also, the laser diodes LD included in the light-emitting element sections 101 to 104 are arranged in the y direction. In other words, the laser diodes LD11, LD12, LD13, and LD14 are arranged in the y direction, the laser diodes LD21, LD22, LD23, and LD24 are arranged in the y direction, the laser diodes LD31, LD32, LD33, and LD34 are arranged in the y direction, and the laser diodes LD41, LD42, LD43, and LD44 are arranged in the y direction. In this way, a two-digit numeral like "LD11" is appended to refer to the individual laser diodes LD. Note that the notation "LDij" may also be used, where "i" is substituted instead of the numeral for the x direction and "j" is substituted instead of the numeral for the y direction. Also, although similar to other cases, in the case of appending a numeral for the x direction only, "i" may be substituted instead of individual numerals, and in the case of appending a numeral for the y direction only, "j" may be substituted instead of individual numerals. Here, i and j are each an integer from 1 to 4.

In the light source 22 applying the third exemplary embodiment, the light-emitting elements are assumed to be the laser diodes LD. The laser diodes LD are vertical-cavity surface-emitting lasers (VCSELs), for example. The laser diodes LD may also be light-emitting diodes LED.

The light source 22 is provided with 16 driving thyristors DT. Each driving thyristor DT is connected to a corresponding laser diode LD. Here, each driving thyristor DT is connected in series to a corresponding laser diode LD. In other words, a driving thyristor DT and a laser diode LD form a pair. Consequently, the driving thyristors DT will be distinguished by referring to the same numerals as the connected laser diodes LD. Note that the driving thyristors DT and the laser diodes LD may also be connected in series by being stacked with a tunnel junction layer in between, similarly to the light-emitting diodes LED and the driving thyristors B in the first exemplary embodiment.

Additionally, the light source 22 is provided with four transfer thyristors T, four setting thyristors S, four coupled diodes D, four connecting diodes Da and Db each, and four power supply line resistors Rg. Furthermore, the light source 22 is provided with a start diode SD and current-limiting resistors R1 and R2. Furthermore, the light source 22 is provided with four simultaneous lighting diodes Dg.

The transfer thyristors T are arranged in the x direction in the order T1, T2, T3, T4. Additionally, the coupled diodes D are arranged in the x direction in the order D1, D2, D3, D4. Note that the coupled diodes D1, D2, and D3 are respectively provided between the transfer thyristors T1, T2, T3, and T4, while the coupled diode D4 is provided on the side of the transfer thyristor T4 opposite from the side where the coupled diode D3 is provided.

The setting thyristors S are arranged in the x direction in the order S1, S2, S3, S4.

The connecting diodes Da and Db and the power supply line resistors Rg are arranged in the x direction similarly.

Because the transfer thyristors T, the setting thyristors S, the coupled diodes D, the connecting diodes Da and Db, and the power supply line resistors Rg are arranged in the x direction, a single-digit numeral is used to refer to each. Note that in some cases, "i" may be substituted instead of individual numerals.

The connecting diodes Da and Db are two-terminal elements provided with an anode and a cathode.

Hereinafter, the connection relationships between the elements in the light source 22 will be described. Note that a description will be omitted for portions that are similar to the light source 20 applying the first exemplary embodiment.

The laser diodes LDij and the driving thyristors DTij are connected in series. In other words, the anodes of the laser diodes LDij are connected to the reference potential Vsub, while the cathodes are connected to the anodes of the driving thyristor DTij.

The reference potential Vsub is supplied through a back electrode provided on the back of the substrate 80.

In addition, the cathodes of the driving thyristors DTi1 included in the light-emitting element section 101 are connected to a lighting signal line 74-1. The lighting signal line 74-1 is connected to a φI1 terminal. The φI1 terminal is supplied with a lighting signal φI1 from a lighting signal generation unit 140 of the controller 112.

The cathodes of the driving thyristors DTi2 included in the light-emitting element section 102 are connected to a lighting signal line 74-2. The lighting signal line 74-2 is connected to a φI2 terminal. The φI2 terminal is supplied with a lighting signal φI2 from the controller 112.

Also, the cathodes of the driving thyristors DTi3 included in the light-emitting element section 103 are connected to a lighting signal line 74-3. The lighting signal line 74-3 is connected to a φI3 terminal. The φI3 terminal is supplied with a lighting signal φI3 from the controller 112.

Similarly, the cathodes of the driving thyristors DTi4 included in the light-emitting element section 104 are connected to a lighting signal line 74-4. The lighting signal line 74-4 is connected to a φI4 terminal. The φI4 terminal is supplied with a lighting signal φI4 from the controller 112.

In other words, the cathodes of the driving thyristors DTij are connected to the lighting signal lines 74-j, and the lighting signal lines 74-j are connected to the φIj terminals. Additionally, the φIj terminals are supplied with the lighting signals φIj from the controller 112.

The anodes of the setting thyristors Si are connected to the reference potential Vsub, while the cathodes are connected to the setting signal line 75. The setting signal line 75 is connected to the φs terminal, and is supplied with the setting signal φs from the controller 112.

The gates Gti of the transfer thyristors Ti are connected to the power supply potential line 71 through the power supply line resistors Rg. The power supply potential line 71 is connected to the Vgk terminal, and is supplied with the power supply potential Vgk (as an example, −3.3 V) from the controller 112.

The gates Gti of the transfer thyristors Ti are connected to the gates of the setting thyristors Si through the connecting diodes Dai. Additionally, the gates Gsi of the setting thyristors Si are connected to the gates Gdij of the driving thyristors DTij through the connecting diodes Dbi.

In other words, multiple pairs (in this case, four pairs) of a driving thyristor DT and a laser diode LD are connected to each setting thyristor S.

The gate Gs1 of the setting thyristor S1 and the gates Gd1j of the driving thyristors DT1j are connected by a gate signal line 55 running from the power supply potential line 71 through the power supply line resistor Rg1 and the connecting diodes Da1 and Db1. The gate Gs2 of the setting thyristor S2 and the gates Gd2j of the driving thyristors DT2j are connected by a gate signal line 56 running from the power supply potential line 71 through the power supply line resistor Rg2 and the connecting diodes Da2 and Db2. The gate Gs3 of the setting thyristor S3 and the gates Gd3j of the driving thyristors DT3j are connected by a gate signal line 57 running from the power supply potential line 71 through the power supply line resistor Rg3 and the connecting diodes Da3 and Db3. The gate Gs4 of the setting thyristor S4 and the gates Gd4j of the driving thyristors DT4j are connected by a gate signal line 58 running from the power supply potential line 71 through the power supply line resistor Rg4 and the connecting diodes Da4 and Db4.

The cathodes of the simultaneous lighting diodes Dgi are connected to the gates Gdij of the driving thyristors DTij. In other words, the cathode of the simultaneous lighting diode Dg1 is connected to the gate signal line 55, the cathode of the simultaneous lighting diode Dg2 is connected to the gate signal line 56, the cathode of the simultaneous lighting diode Dg3 is connected to the gate signal line 57, and the cathode of the simultaneous lighting diode Dg4 is connected to the gate signal line 58. Additionally, as an example, the anodes of the simultaneous lighting diodes Dg1 and Dg2 are connected to the φg1 terminal. The φg1 terminal is supplied with the simultaneous lighting signal φg1 from the simultaneous lighting signal generation unit 190 in the controller 112. The anodes of the simultaneous lighting diodes Dg3 and Dg4 are connected to the φg2 terminal. The φg2 terminal is supplied with the simultaneous lighting signal φg2 from the simultaneous lighting signal generation unit 190 in the controller 112.

The configuration of the controller 112 will be described. Like the controller 111 of the second exemplary embodiment, the controller 112 is provided with a transfer signal generation unit 120, a setting signal generation unit 180, a lighting signal generation unit 140, a reference potential supply unit 160, a power supply potential supply unit 170, and a simultaneous lighting signal generation unit 190. Note that the lighting signal generation unit 140 generates and supplies the lighting signals φIj to the φIj terminals of the light source 22.

In the above, the laser diodes LD are disposed in a 4×4 two-dimensional array, but the array is not limited to 4×4. The numerals i and j in i×j may have plural values other than 4. Additionally, it is sufficient for the number of transfer thyristors T and setting thyristors S to be i. Note that the number of transfer thyristors T and setting thyristors S may also exceed i.

(Successive Lighting Operation in Light-Emitting Device 4B)

Next, the operation of causing the laser diodes LD of the light source 22 in the light-emitting device 4B to emit light successively will be described.

First, a basic successive lighting operation in the light source 22 will be described. Here, the case of causing the laser diode LD11 to light up will be described. The power supply potential Vgk is "L" (−3.3 V), and the reference potential Vsub is "H" (0 V). In addition, the simultaneous lighting signals φg1 and φg2 are set to "L" (−3.3 V).

In the case of causing the laser diode LD11 to light up, the lighting signal φI1 is set to "L" (−3.3 V) and the setting signal φs is set to "H" (0 V). The ON state of the transfer thyristors T is transferred similarly to the light source 20 of the light-emitting device 4 applying the first exemplary embodiment. When the transfer thyristor T1 changes to the ON state, the gate Gt1 goes to 0 V. This causes the gate Gs1 of the setting thyristor S1 to go to −1.5 V through the connecting diodes Da1 connected to the gate Gt1. This causes the threshold voltage of the setting thyristor S1 to go to −3.0 V. At this point, if the setting signal φs is set to "L" (−3.3 V), the setting thyristor S1 turns on, and the gate Gs1 goes to 0 V. Thereafter, the gate Gd11 of the driving thyristor DT11 goes to −1.5 V through the connecting diode Db1 connected to the gate Gs1. This causes the threshold voltage of the driving thyristor DT11 to go to −3.0 V. With this arrangement, the laser diode LD11 lights up.

In other words, when the potential of the gate Gd (a gate signal line such as the gate signal line 55) of the driving thyristor DT goes to −1.5 V, the driving thyristor DT is in a ready state to switch to the ON state. Additionally, if the lighting signal φI is "L" (−3.3 V), the driving thyristor DT changes to the ON state, and the laser diode LD lights up (emits light). In other words, by switching the driving thyristor DT to the ON state, the driving thyristor DT drives the laser diode LD to light up.

FIG. 10 is a diagram illustrating an example of controlling the lighted/unlighted state of the laser diodes LD in the light source 22 provided with 4×4 laser diodes LD applying the third exemplary embodiment. Here, "ON" indicates a laser diode LD in the lighted (emitting) state, while "OFF" indicates a laser diode LD in the unlighted (non-emitting) state. In other words, the laser diodes LD11, LD12, LD14, LD21, LD23, LD31, LD32, LD41, LD43, and LD44 are in the lighted (emitting) state, while the laser diodes LD13, LD22, LD24, LD33, LD34, and LD42 are in the unlighted (non-emitting) state. In other words, in the laser diodes LD arranged in a 4×4 two-dimensional array, predetermined laser diodes LD are made to light up in parallel. However, when the ON state of the transfer thyristors T is transferred, the laser diodes LD are driven to start lighting up successively.

Figure 11:
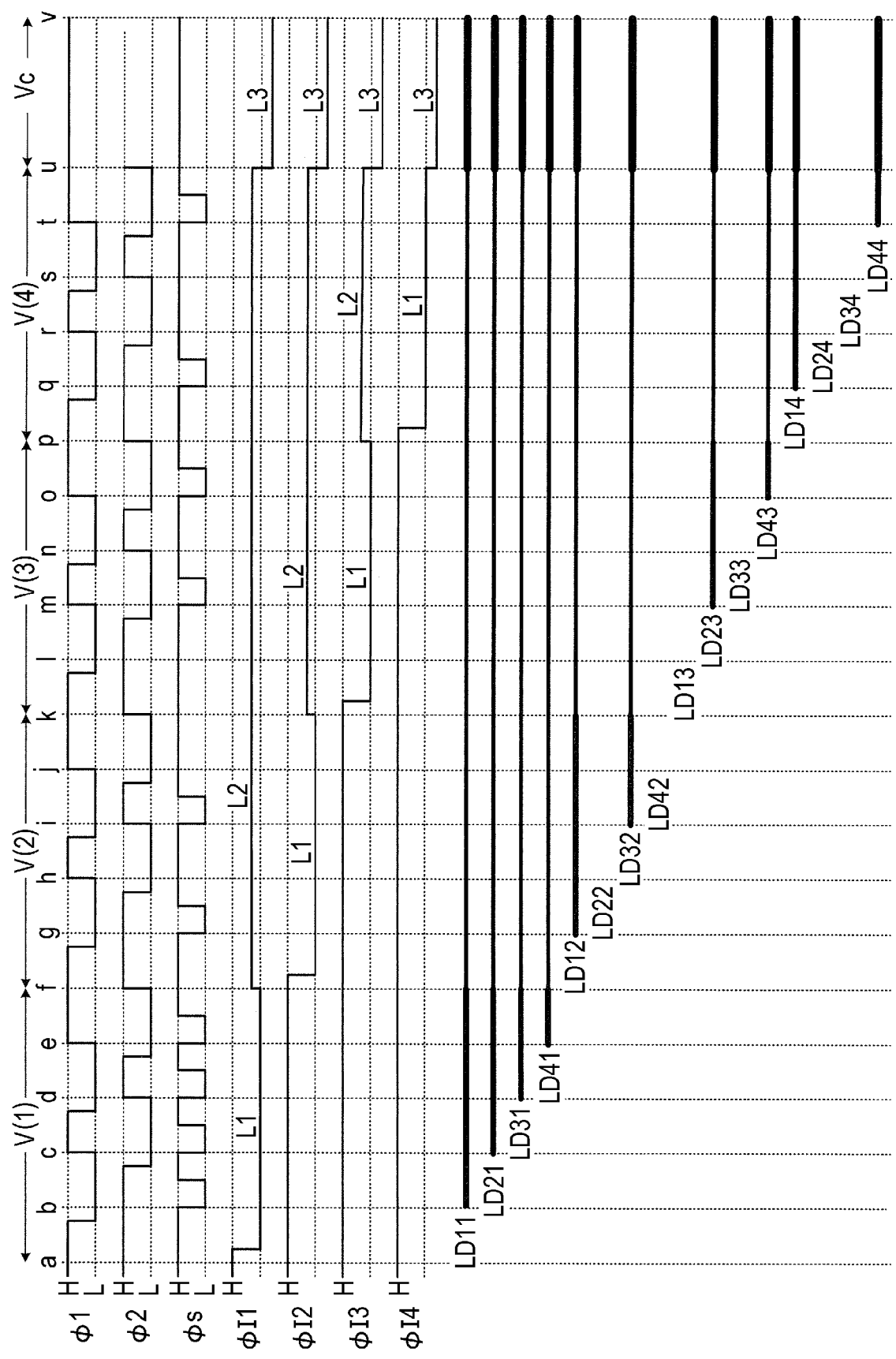
FIG. 11 is a timing chart for explaining an operation of successively lighting up 4×4 laser diodes provided in a light source applying the third exemplary embodiment.

FIG. 11 is a timing chart for explaining an operation of successively lighting up the 4×4 laser diodes LD provided in the light source 22 applying the third exemplary embodiment. Time is assumed to elapse in alphabetical order (a, b, c, and so on). Note that the times a, b, c, and so on in FIG. 11 are different from the times a, b, c, and so on illustrated in FIGS. 6 and 8.

Here, the laser diodes LD are set to the lighted (emitting) state or the unlighted (non-emitting) state as illustrated in FIG. 10. Consequently, setting periods V(1) to V(4) (hereinafter referred to as the setting periods V when not being distinguished individually) for determining whether to set the laser diodes LD to the lighted state or the unlighted state and a lighting maintenance period Vc in which the lighted states of the lighted laser diodes LD are maintained in parallel are provided.

The setting period V(1) for the laser diodes LD11, LD21, LD31, and LD41 is from the time a to the time f, the setting period V(2) for the laser diodes LD12, LD22, LD32, and LD42 is from the time f to the time k, the setting period V(3) for the laser diodes LD13, LD23, LD33, and LD43 is from the time k to the time p, and the setting period V(4) for the laser diodes LD14, LD24, LD34, and LD44 is from the time p to the time u. Additionally, the lighting maintenance period Vc in which the lighted states of the lighted laser diodes LD are maintained in parallel is from the time u to the time v. In FIG. 10, the setting periods V are illustrated as being longer than the lighting maintenance period Vc, but it is suitable for the lighting maintenance period Vc to be set longer than the setting periods V. Compared to the case where the setting periods V are longer than the lighting maintenance period Vc, differences in intensity dependent on the emission order among the multiple laser diodes LD are reduced.

Because the setting periods V(1) to V(4) are basically the same, the setting period V(1) will be described mainly.

The lighting signals φI1, φI2, φI3, and φI4 are signals having the four potentials of "H" (0 V), "L1" (−3.1 V), "L2" (−2.5 V), and "L3" (−3.5 V). The lighting signal φI1 is "H" (0 V) at the time a of the setting period V(1), and goes to "L1" (−3.1 V) between the time a and the time b. Additionally, the lighting signal φI1 goes to "L2" (−2.5 V) at the time f when the setting period V(1) ends the setting period V(2) begins. Additionally, the lighting signal φI1 goes to "L3" (−3.5 V) at the time u when the setting period V(4) ends and the lighting maintenance period Vc begins. Additionally, the lighting signal φI1 returns to "H" (0 V) at the time v when the lighting maintenance period Vc ends. The same applies to the other lighting signals φI2, φI3, and φI4.

At the time b when the lighting signal φI1 is "L1" (−3.1 V) and the transfer thyristor T1 is in the ON state, if the setting signal φs goes from "H" to "L", the setting thyristor S1 turns on and enters the ON state. As described above, this causes the threshold voltage of the driving thyristor DT11 to go to −3.0 V. Consequently, the driving thyristor DT11 turns on. Because the voltage across the anode and cathode of the driving thyristor DT11 in the ON state is 0.8 V, a potential of 2.3 V is applied to the laser diode LD11. Because the rising voltage of the laser diode LD11 is 1.5 V, the laser diode LD11 also lights up (emits light).

Similarly, at the time c when the lighting signal φI1 is "L1" (−3.1 V) and the transfer thyristor T2 is in the ON state, if the setting signal φs goes from "H" to "L", the setting thyristor S1 turns on and enters the ON state. This causes the threshold voltage of the driving thyristor DT21 to go to −3.0 V. Consequently, the driving thyristor DT21 turns on, and the laser diode LD21 lights up (emits light). The same applies to the other laser diodes LD31 and LD41. In other words, at the time f, the laser diodes LD11 to LD41 are in the lighted state. At this time, the lighting signal φI1 goes from "L1" (−3.1 V) to "L2" (−2.5 V). However, if the cathode of the driving thyristor DT11 is at −2.3 V, the ON state is maintained. Consequently, the laser diodes LD11 to LD41 remain in the lighted state until the time u. Thereafter, when the lighting signal φI1 goes from "L2" (−2.5 V) to "L3" (−3.5 V) at the time u, the light emission by the laser diodes LD11 to LD41 in the lighted state becomes brighter (that is, the intensity increases).

Additionally, when the lighting signal φI1 returns from "L3" (−3.5 V) to "H" (0 V), the laser diodes LD11 to LD41 in the lighted state do dark and enter the unlighted (non-emitting) state.

The same applies to the other laser diodes LDij. In other words, in the setting periods V(1), V(2), V(3), and V(4), the laser diodes LD are made to light up and maintain the lighted state. Additionally, in the lighting maintenance period Vc, the light emission by the laser diodes LD in the lighted state becomes brighter (that is, the intensity increases). In this way, the laser diodes LD are made to start lighting up successively. The light source 22 is configured as a self-scanning light-emitting device (SLED).

Operations by the light source 22 not described here are similar to the operations by the light source 20 described in the first exemplary embodiment, and therefore further description is omitted.

(Full Simultaneous Lighting Operation by Light Source 22 in Light-Emitting Device 4B)

A full simultaneous lighting operation that causes all of the laser diodes LD to light up simultaneously in parallel in the light source 22 will be described.

To cause one of the laser diodes LD to light up, it is sufficient to turn on the driving thyristor DT with one of the lighting signals φI. Therefore, in the full simultaneous lighting operation, the driving thyristors DT connected to the laser diodes LD are turned on with the lighting signals φI.

In the successive lighting operation by the light-emitting device 4B, the power supply potential Vgk supplied by the power supply potential supply unit 170 of the controller 112 is set to "L" (−3.3 V). In the full simultaneous lighting operation, the reference potential Vsub supplied by the reference potential supply unit 160 and the power supply potential Vgk supplied by the power supply potential supply unit 170 of the controller 112 are set to "H" (0 V). Additionally, the lighting signals φl1 to φl4 generated by the lighting signal generation unit 140 are set to "L1" (−3.2 V) or "L3" (−3.5 V).

When the power supply potential Vgk is set to "H" (0 V), the gates Gd of the driving thyristors DT connected to the power supply potential line 71 at "H" (0 V) go to "H" (0 V) through the power supply line resistors Rg and the connecting diodes Da and Db, and the threshold voltage of the driving thyristors DT goes to −1.5 V. Consequently, if the lighting signals φl1 to φl4 go to "L1" (−3.2 V) or "L3" (−3.5 V), the driving thyristors DT turn on and the laser diodes LD light up. In other words, all of the laser diodes LD light up simultaneously in parallel. This state is not influenced by the potentials of the other signals (the transfer signals φ1 and φ2, the setting signal cps, or the simultaneous lighting signals φg1 and φg2). Consequently, the potentials of the other terminals (φ1 terminal, φ2 terminal, φs terminal, φg1 terminal, and φg2 terminal) do not have to be set. That is, the other terminals (φ1 terminal, φ2 terminal, φs terminal, φg1 terminal, and φg2 terminal) may be open.

(Partial Simultaneous Lighting Operation by Light Source 22 in Light-Emitting Device 4B)

A partial simultaneous lighting operation that causes a portion of the multiple laser diodes LD to light up as a group in the light source 22 will be described.

To cause one of the laser diodes LD to light up, it is sufficient to turn on the driving thyristor DT with one of the lighting signals φl. Therefore, in the partial simultaneous lighting operation, the driving thyristors DT connected to a group of laser diodes LD are turned on with one of the lighting signals φl.

For example, in the case of causing the laser diodes LD11 and LD21 to light up as a group simultaneously in parallel, the reference potential supply unit 160 of the controller 112 sets the reference potential Vsub to "H" (0 V). Additionally, the simultaneous lighting signal φg1 (the simultaneous lighting signal φg1 supplied to the anode of the simultaneous lighting diodes Dg1 and Dg2) of the simultaneous lighting signal generation unit 190 is set to "H" (0 V), and the lighting signal φl1 of the lighting signal generation unit 140 is set to "L1" (−3.2 V) or "L3" (−3.5 V). In other words, when the simultaneous lighting signal φg1 is set to "H" (0 V), the threshold voltage of the driving thyristors DT11 and DT21 goes to −3.0 V. Because the lighting signal φl1 is "L1" (−3.2 V) or "L3" (−3.5 V), the driving thyristors DT11 and DT21 turn on, and the laser diodes LD11 and LD21 light up. Note that if the lighting signals φl2, φl3, and φl4 are set to "L1" (−3.2 V) or "L3" (−3.5 V), the laser diodes LD12, LD22, LD13, LD23, LD14, and LD24 also light up. In this way, the group of laser diodes LD to light up is changed by combining the lighting signal φl and the simultaneous lighting signal φg.

Note that in FIG. 9, the anodes of the simultaneous lighting diodes Dg1 and Dg2 are connected by wiring to the simultaneous lighting signal generation unit 190 of the controller 112, and the anodes of the simultaneous lighting diodes Dg3 and 4 are connected by wiring to the simultaneous lighting signal generation unit 190 of the controller 112. However, the anode of each simultaneous lighting diode Dg may also be connected to the simultaneous lighting signal generation unit 190 individually, and the simultaneous lighting signal generation unit 190 may select which laser diodes LD to treat as a group through a combination of the simultaneous lighting diodes Dg.

Also, in the case of performing the successive lighting operation and the full simultaneous lighting operation, without performing the partial simultaneous lighting operation, the simultaneous lighting diodes Dg do not have to be provided. Furthermore, the simultaneous lighting signal generation unit 190 does not have to be provided in the controller 112.

Fourth Exemplary Embodiment

In the light-emitting device 4B applying the third exemplary embodiment, transfer thyristors are provided along an edge of light-emitting elements arranged in a two-dimensional array, thereby causing the ON state to be self-scanning. In a light-emitting device 4C applying the fourth exemplary embodiment, transfer thyristors are provided along two edges of light-emitting elements arranged in a two-dimensional array, thereby causing the ON state to transfer along two edges.

Figure 12:
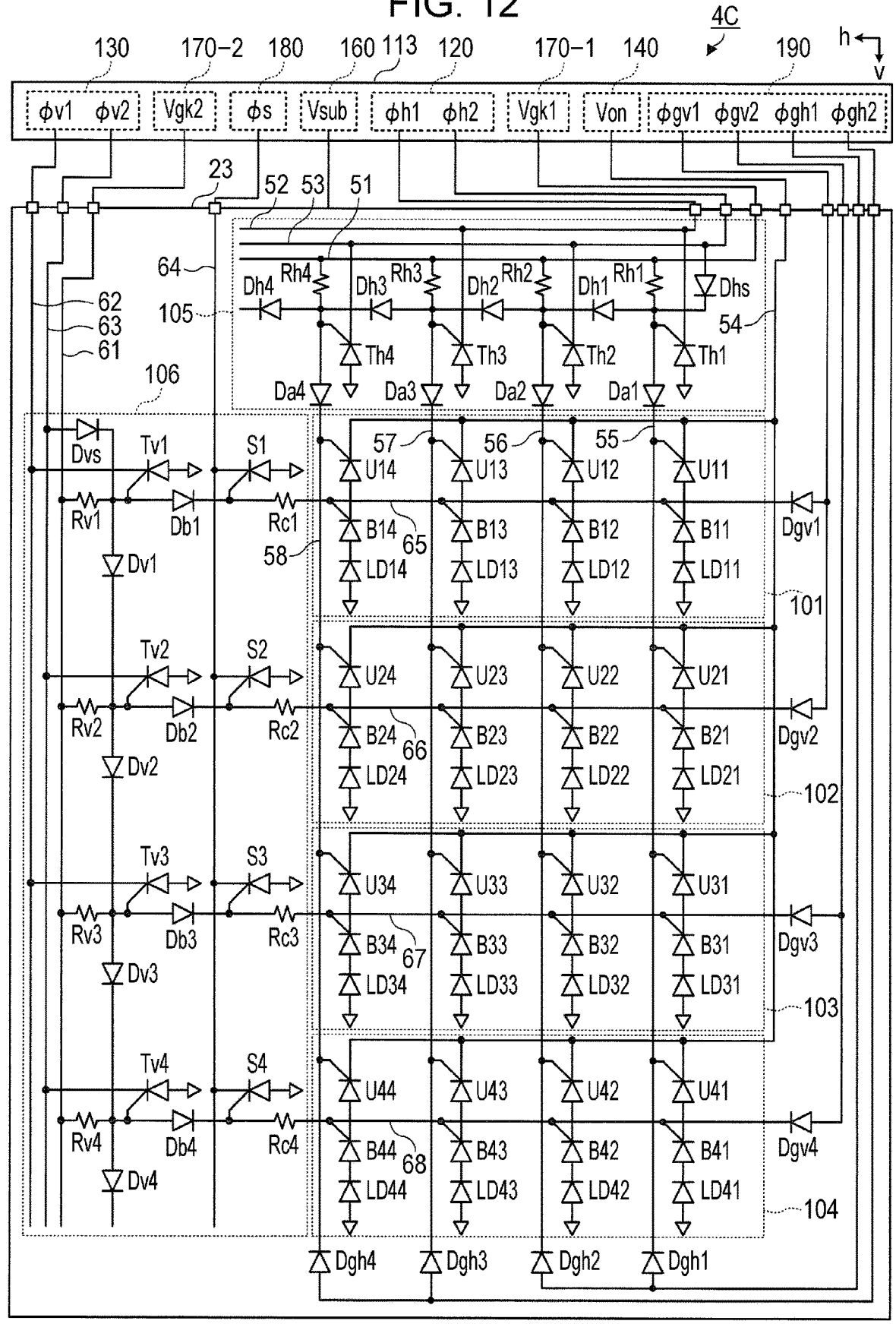
FIG. 12 is an equivalent circuit of a light source applying a fourth exemplary embodiment.

FIG. 12 is an equivalent circuit of a light source 23 applying the fourth exemplary embodiment. Note that in FIG. 7, the controller 113 is also illustrated. On the page of FIG. 12, the direction going from right to left is defined as the horizontal direction (hereinafter referred to as the h direction), and the direction going from top to bottom is defined as the vertical direction (hereinafter referred to as the v direction). A two-dimensional array means that the arrangement has two dimensions, and refers to an arrangement extending in the horizontal direction and the vertical direction. Here, the h direction and the v direction are orthogonal, but do not have to be orthogonal.

The light source 23 is provided with an h direction transfer unit 105, a v direction transfer unit 106, and multiple laser diodes LD. The laser diodes LD are an example of light-emitting elements, and are vertical-cavity surface-emitting laser (VCSELs) for example.

The light source 23 is provided with a row of laser diodes LD11, LD12, LD13, and LD14, a row of laser diodes LD21, LD22, LD23, and LD24, a row of laser diodes LD31, LD32, LD33, and LD34, and a row of laser diodes LD41, LD42, LD43, and LD44, where the laser diodes LD in each row are arranged in the h direction. These rows are arranged in the above order in the v direction. In other words, a column of the laser diodes LD11, LD21, LD31, and LD41, a column of the laser diodes LD12, LD22, LD32, and LD42, a column of the laser diodes LD13, LD23, LD33, and LD43, and a column of the laser diodes LD14, LD24, LD34, and LD44 are provided, where the laser diodes LD in each column are arranged in the v direction.

As above, a two-digit numeral like "LD11" is appended to refer to the individual laser diodes LD. Note that the notation "LDji" may also be used, where "i" is substituted instead of the numeral for the h direction and "j" is substituted instead of the numeral for the v direction. Also, although similar to other cases, in the case of appending a numeral for the h direction only, "i" may be substituted instead of individual numerals, and in the case of appending a numeral for the v direction only, "j" may be substituted instead of individual numerals. Here, i and j are each an integer from 1 to 4.

Additionally, the light source 23 is further provided with 16 driving thyristors B and 16 driving thyristors U. Each of the driving thyristors B and U is connected to a corresponding laser diode LD. Here, a laser diode LD, a driving thyristor B, and a driving thyristor U are connected in series in the order of laser diode LD, driving thyristor B, driving thyristor U. In other words, a laser diode LD, a driving thyristor B, and a driving thyristor U form a group. Consequently, the driving thyristors B and U will be distinguished by referring to the same numerals as the connected laser diodes LD. Note that the laser diodes LD may also be connected in series to each of the driving thyristors B and U by being stacked with a tunnel junction layer in between each, similarly to the light-emitting diodes LED and the driving thyristors B in the first exemplary embodiment.

The h direction transfer unit 105 is provided with four transfer thyristors Th, four coupled diodes Dh, four connecting diodes Da, and four resistors Rh. Furthermore, the h direction transfer unit 105 is provided with a start diode Dhs.

The transfer thyristors Th are arranged in the h direction in the order Th1, Th2, Th3, Th4. Additionally, the coupled diodes Dh are arranged in the h direction in the order Dh1, Dh2, Dh3, Dh4. Note that the coupled diodes Dh1, Dh2, and Dh3 are respectively provided between the transfer thyristors Th1, Th2, Th3, and Th4, while the coupled diode Dh4 is provided on the side of the transfer thyristor Th4 opposite from the side where the coupled diode Dh3 is provided. The connecting diodes Da and the resistors Rh are arranged in the h direction similarly.

Because the transfer thyristors Th, the coupled diodes Dh, the connecting diodes Da, and the resistors Rh are arranged in the h direction, a single-digit numeral is used to refer to each. Note that in some cases, "i" may be substituted instead of individual numerals.

The v direction transfer unit 106 is provided with four transfer thyristors Tv, four coupled diodes Dv, four setting thyristors S, four connecting diodes Db, four connecting resistors Rc, and four resistors Rv. Furthermore, the v direction transfer unit 106 is provided with a start diode Dvs.

The transfer thyristors Tv are arranged in the v direction in the order Tv1, Tv2, Tv3, Tv4. Additionally, the coupled diodes Dv are arranged in the v direction in the order Dv1, Dv2, Dv3, Dv4. Note that the coupled diodes Dv1, Dv2, and Dv3 are respectively provided between the transfer thyristors Tv1, Tv2, Tv3, and Tv4, while the coupled diode Dv4 is provided on the side of the transfer thyristor Tv4 opposite from the side where the coupled diode Dv3 is provided.

The setting thyristors S are arranged in the v direction in the order S1, S2, S3, S4.

The connecting diodes Db, connecting resistors Rc, and resistors Rv are arranged in the v direction similarly.

Because the transfer thyristors Tv, the coupled diodes Dv, the setting thyristors S, the connecting diodes Db, the connecting resistors Rc, and the resistors Rv are arranged in the v direction, a single-digit numeral is used to refer to each. Note that in some cases, "j" may be substituted instead of individual numerals.

Furthermore, the light source 23 is provided with four simultaneous lighting diodes Dgh and four simultaneous lighting diodes Dgv. Because the simultaneous lighting diodes Dgh are arranged in the h direction, a single-digit numeral is used to refer to each. Note that in some cases, "i" may be substituted instead of individual numerals. Because the simultaneous lighting diodes Dgv are arranged in the v direction, a single-digit numeral is used to refer to each. Note that in some cases, "j" may be substituted instead of individual numerals.

The laser diodes LD, the coupled diodes Dh and Dv, the connecting diodes Da and Db, and the simultaneous lighting diodes Dgh and Dgv are two-terminal elements provided with an anode and a cathode.

The transfer thyristors Th and Tv, the setting thyristors S, and the driving thyristors U and B are three-terminal elements provided with an anode, a cathode, and a gate.

The laser diodes LDji, the driving thyristors Bji, and the driving thyristors Uji form groups connected in series. In other words, the anodes of the laser diodes LDji are connected to the reference potential Vsub, and the cathodes of the laser diodes LDji are connected to the anodes of the driving thyristors Bji. The cathodes of the driving thyristors Bji are connected to the anodes of the driving thyristors Uji. The cathodes of the driving thyristors Uji are connected to a lighting signal line 54 supplied with a lighting signal Von that supplies a current for causing the laser diodes LDji to emit light.

In other words, all of the groups of the laser diodes LDji, the driving thyristors Bji, and the driving thyristors Uji connected in series are connected in parallel with the anodes of the laser diodes LDji connected to the reference potential Vsub and the cathodes of the driving thyristors Uji connected to the lighting signal line 54.

In the h direction transfer unit 105, the transfer thyristors Thi are connected to the reference potential Vsub. The cathodes of the odd-numbered transfer thyristors Th1 and Th3 are connected to a transfer signal line 52. The transfer signal line 52 is supplied with a transfer signal $\varphi h1$ from the controller 113. The cathodes of the even-numbered transfer thyristors Th2 and Th4 are connected to a transfer signal line 53. The transfer signal line 52 is supplied with a transfer signal $\varphi h2$ from the controller 113.

The coupled diodes Dhi are connected in series. In other words, the cathode of one coupled diode Dh is connected to the anode of the coupled diode Dh adjacent in +h direction. Additionally, the anodes of the coupled diodes Dhi are connected to the gates of the transfer thyristors Thi. Also, the gates of the transfer thyristors Thi are connected to a power supply potential line 51 on which an h direction power supply potential Vgk1 is supplied to the h direction transfer unit 105.

The anode of the start diode Dhs is connected to the transfer signal line 53 supplied with the transfer signal $\varphi h2$, while the cathode is connected to the anode of the coupled diode Dh1.

Additionally, the anodes of the connecting diodes Dai are connected to the gates of the transfer thyristors Thi, while the cathodes are connected in parallel to the gates of the driving thyristors Uji. In other words, the cathode of the connecting diode Da1 is connected in parallel to the gates of the driving thyristors Uj1 through an h gate signal line 55. The cathode of the connecting diode Da2 is connected in parallel to the gates of the driving thyristors Uj2 through an h gate signal line 56. The cathode of the connecting diode Da3 is connected in parallel to the gates of the driving thyristors Uj3 through an h gate signal line 57. The cathode of the connecting diode Da4 is connected in parallel to the gates of the driving thyristors Uj4 through an h gate signal line 58. Note that the h gate signal lines 55 to 58 will be referred to as the h gate signal lines when not being distinguished individually.

In the v direction transfer unit 106, the transfer thyristors Tvj are connected to the reference potential Vsub. The cathodes of the odd-numbered transfer thyristors Tv1 and Tv3 are connected to a transfer signal line 62. The transfer signal line 62 is supplied with a transfer signal $\varphi v1$ from the controller 113. The cathodes of the even-numbered transfer thyristors Tv2 and Tv4 are connected to a transfer signal line 63. The transfer signal line 63 is supplied with a transfer signal $\varphi v2$ from the controller 113.

The coupled diodes Dvj are connected in series. In other words, the cathode of one coupled diode Dv is connected to the anode of the coupled diode Dv adjacent in +v direction. Additionally, the anodes of the coupled diodes Dvj are connected to the gates of the transfer thyristors Tvj. Also, the gates of the transfer thyristors Tvj are connected to a power supply potential line 61 on which a v direction power supply potential Vgk2 is supplied to the v direction transfer unit 106.

The anode of the start diode Dvs is connected to the transfer signal line 63 supplied with the transfer signal φv2, while the cathode is connected to the anode of the coupled diode Dv1.

The anodes of the setting thyristors Sj are connected to the reference potential Vsub, while the cathodes are connected to a setting signal line 64 supplied with a setting signal φs from the controller 113. Additionally, the anodes of the connecting diodes Dbj are connected to the gates of the transfer thyristors Tvj, while the cathodes are connected to the gates of the setting thyristors Sj. Furthermore, one end of the connecting resistors Rcj is connected to the gates of the setting thyristors Sj, while the other end is connected in parallel to the gates of the driving thyristors Bji. In other words, the connecting diode Db1 is connected to the driving thyristors B1$i$ through the connecting resistor Rc1 and a v gate signal line 65. The connecting diode Db2 is connected to the driving thyristors B2$i$ through the connecting resistor Rc2 and a v gate signal line 66. The connecting diode Db3 is connected to the driving thyristors B3$i$ through the connecting resistor Rc3 and a v gate signal line 67. The connecting diode Db4 is connected to the driving thyristors B4$i$ through the connecting resistor Rc4 and a v gate signal line 68. Note that the v gate signal lines 65 to 68 will be referred to as the v gate signal lines when not being distinguished individually.

The cathode of the simultaneous lighting diode Dgh1 is connected to the h gate signal line 55. The cathode of the simultaneous lighting diode Dgh2 is connected to the h gate signal line 56. The anodes of the simultaneous lighting diodes Dgh1 and Dgh2 are connected to a φgh1 terminal. The φgh1 terminal is supplied with a simultaneous lighting signal φgh1 from a simultaneous lighting signal generation unit 190 of the controller 113. The cathode of the simultaneous lighting diode Dgh3 is connected to the h gate signal line 57. The cathode of the simultaneous lighting diode Dgh4 is connected to the h gate signal line 58. The anodes of the simultaneous lighting diodes Dgh3 and Dgh4 are connected to a φgh2 terminal. The φgh2 terminal is supplied with a simultaneous lighting signal φgh2 from the simultaneous lighting signal generation unit 190 of the controller 113.

The h gate signal lines 55 to 58 and the v gate signal lines 65 to 68 are an example of driving signal lines, and the potentials set on the h gate signal lines 55 to 58 and the v gate signal lines 65 to 68 are an example of driving signals.

The cathode of the simultaneous lighting diode Dgv1 is connected to the v gate signal line 65. The cathode of the simultaneous lighting diode Dgv2 is connected to the v gate signal line 66. The anodes of the simultaneous lighting diodes Dgv1 and Dgv2 are connected to a φgv1 terminal. The φgv1 terminal is supplied with a simultaneous lighting signal φgv1 from the simultaneous lighting signal generation unit 190 of the controller 113. The cathode of the simultaneous lighting diode Dgv3 is connected to the v gate signal line 67. The cathode of the simultaneous lighting diode Dgv4 is connected to the v gate signal line 68. The anodes of the simultaneous lighting diodes Dgv3 and Dgv4 are connected to a φgv2 terminal. The φgv2 terminal is supplied with a simultaneous lighting signal φgv2 from the simultaneous lighting signal generation unit 190 of the controller 113.

In the above, the laser diodes LD are disposed in a 4×4 two-dimensional array, but the array is not limited to 4×4. The numerals i and j in j×i may have plural values other than 4. Additionally, it is sufficient for the number of transfer thyristors Th to be i, and it is sufficient for the number of transfer thyristors Tv and setting thyristors S to be j. Note that the number of transfer thyristors Th may also exceed i. The number of transfer thyristors Tv and setting thyristors S may also exceed j.

(Successive Lighting Operation in Light-Emitting Device 4C)

Next, the operation of causing the laser diodes LD of the light source 23 in the light-emitting device 4C to emit light successively will be described.

First, a basic successive lighting operation in the light source 23 will be described. Here, the case of causing the laser diode LD11 to light up will be described. The power supply potentials Vgk1 and Vgk2 are "L" (−3.3 V), and the reference potential Vsub is "H" (0 V). At this time, it is assumed that the lighting signal Von is set to "L" (−3.3 V). In addition, the simultaneous lighting signals φgh1, φgh2, φgv1, and φgv2 are set to "L" (−3.3 V).

When causing the laser diode LD11 to light up, the transfer thyristor Th1 and the transfer thyristor Tv1 corresponding to the laser diode LD11 are switched to the ON state to set the laser diode LD11 as the lighting target. When the transfer thyristor Th1 is switched to the ON state, the gate of the transfer thyristor Th1 goes to 0 V, and the h gate signal line 55 goes to −1.5 V through the connecting diode Da1. This causes the threshold voltage of the driving thyristor U11 to go to −3.0 V. On the other hand, when the transfer thyristor Tv1 is switched to the ON state, the gate of the transfer thyristor Tv1 goes to 0 V, and the gate of the setting thyristor S1 goes to −1.5 V through the connecting diode Db1. This causes the threshold voltage of the setting thyristor S1 to go to −3.0 V.

Next, when causing the setting signal φs to go from "H" (0 V) to "L"' (−3.0 V), the setting thyristor S1 turns on and the gate of the setting thyristor S1 goes to 0 V. This causes the v gate signal line 65 connected to the gate of the setting thyristor S1 through the connecting resistor Rc1 to go to 0 V. In other words, the gate of the driving thyristor B11 goes to 0 V. With this arrangement, the cathode of the driving thyristor B11 (anode of the driving thyristor U11) goes to −1.5 V. This causes the potential applied between the cathode and the anode of the driving thyristor U11 to go to −1.8 V, and the driving thyristor U11 turns on.

When the driving thyristor U11 is switched to the ON state and a current begins to flow through the driving thyristor U11, a current also flows between the gate and the cathode of the driving thyristor B11. This causes the gate of the driving thyristor B11 to approach −0.8 V due to the voltage drop across the connecting resistor Rc1. With this arrangement, the cathode of the driving thyristor B11 (anode of the driving thyristor U11) approaches −2.3 V. At this time, the anode of the driving thyristor B11 is connected to the cathode of the laser diode LD11, and therefore goes to −1.5 V. In other words, a potential of 0.8 V is applied between the anode and the cathode of the driving thyristor B11. With this arrangement, the driving thyristor B11 turns on. This causes a current to flow through the laser diode LD11, the driving thyristor B11, and the driving thyristor U11, and the laser diode LD11 lights up.

In other words, when the potential of the h gate signal line (an h gate signal line such as the h gate signal line 55) connected to the gate of each driving thyristor U is set to −1.5 V and the potential of the v gate signal line (a v gate signal line) such as the v gate signal line 65) connected to the gate of each driving thyristor B goes to 0 V, each driving thyristor U and B is in a ready state to switch to the ON state. Additionally, if the lighting signal Von is "L" (−3.3 V), the driving thyristors U and B change to the ON state, and the laser diode LD lights up (emits light). In other words, by switching the driving thyristors U and B to the ON state, the driving thyristors U and B drive the laser diode LD to light up.

As described above, the transfer thyristors Thi are successively switched to the ON state, and the transfer thyristors Tvj are also successively switched to the ON state. Additionally, the laser diodes LDji specified by the transfer thyristors Thi in the ON state and the transfer thyristors Tvj in the ON state are made to light up. The light source 23 is configured as a self-scanning light-emitting device (SLED).

Figure 13:
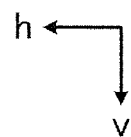
FIG. 13 is a diagram illustrating an example of setting the lighted/unlighted state of laser diodes in a light source provided with 4×4 laser diodes applying the fourth exemplary embodiment.

FIG. 13 is a diagram illustrating an example of setting the lighted/unlighted state of the laser diodes LD in the light source 23 provided with 4×4 laser diodes LD applying the fourth exemplary embodiment. Here, "ON" indicates a laser diode LD in the lighted (emitting) state, while "OFF" indicates a laser diode LD in the unlighted (non-emitting) state. In other words, the laser diodes LD11, LD12, LD14, LD21, LD23, LD32, LD34, LD41, LD42, and LD44 are in the lighted (emitting) state, while the laser diodes LD13, LD22, LD24, LD31, LD33, and LD43 are in the unlighted (non-emitting) state. In other words, in the laser diodes LD arranged in a 4×4 two-dimensional array, predetermined laser diodes LD are made to light up in parallel.

Figure 14:
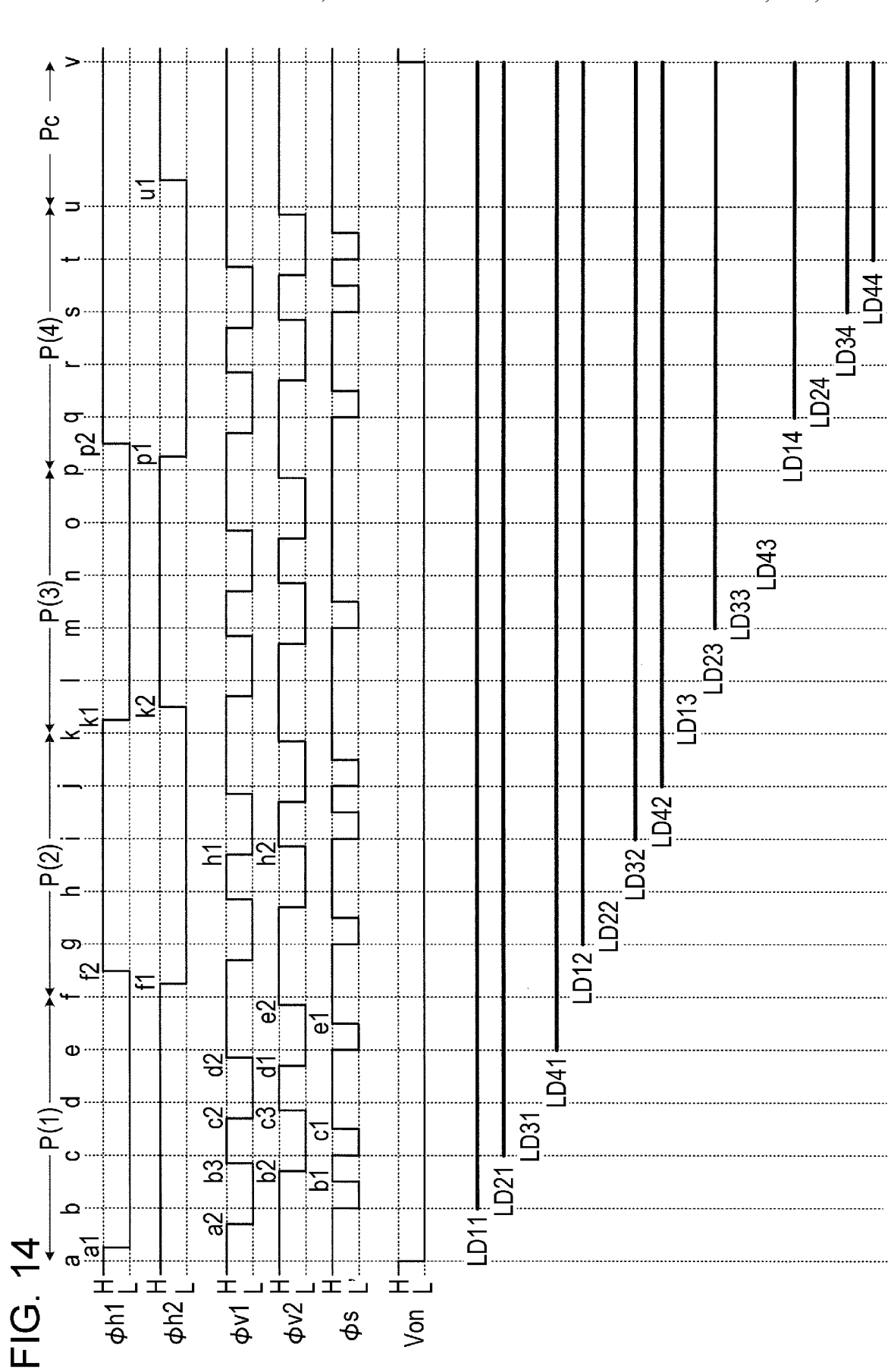
FIG. 14 is a timing chart for explaining an operation of successively lighting up 4×4 laser diodes provided in a light source applying the fourth exemplary embodiment.

FIG. 14 is a timing chart for explaining an operation of successively lighting up the 4×4 laser diodes LD provided in the light source 23 applying the fourth exemplary embodiment. Time is assumed to elapse in alphabetical order (a, b, c, and so on). Note that the times a, b, c, and so on in FIG. 14 are different from the times a, b, c, and so on illustrated in FIGS. 6, 8, and 11.

Here, the laser diodes LD are assumed to be set to the lighted (emitting) state or the unlighted (non-emitting) state as illustrated in FIG. 13. Setting periods P(1) to P(4) (hereinafter referred to as the setting periods P when not being distinguished individually) for setting the lighted or unlighted state of the laser diodes LD and a lighting maintenance period Pc in which the lighted states of the lighted laser diodes LD are maintained in parallel as the lighting target are provided.

The setting period P(1) for the laser diodes LD11, LD21, LD31, and LD41 is from the time a to the time f, the setting period P(2) for the laser diodes LD12, LD22, LD32, and LD42 is from the time f to the time k, the setting period P(3) for the laser diodes LD13, LD23, LD33, and LD43 is from the time k to the time p, and the setting period P(4) for the laser diodes LD14, LD24, LD34, and LD44 is from the time p to the time u. Additionally, the lighting maintenance period Pc in which the lighted states of the lighted laser diodes LD are maintained in parallel as the lighting target is from the time u to the time v. In other words, in the setting periods P(1) to P(4), the lighting maintenance period Pc in which the laser diodes LD treated as the lighting target are maintained in parallel in the lighted state begins at the time point at which the lighting of the laser diodes LD treated as the lighting target is completed.

In FIG. 14, the setting periods P are illustrated as being longer than the lighting maintenance period Pc, but it is suitable for the lighting maintenance period Pc to be set longer than the setting periods P. Compared to the case where the setting periods P, which are an example of a first period, are longer than the lighting maintenance period Pc, differences in intensity dependent on the emission order among the multiple laser diodes LD are reduced.

Because the setting periods P(1) to P(4) are basically the same, the setting period P(1) will be described mainly.

Here, the reference potential Vsub is "H" (0 V), while the h direction power supply potential Vgk1 and the v direction power supply potential Vgk2 are "L" (−3.3 V). The lighting signal Von goes between "H" (0 V) and "L" (−3.3 V). The setting signal φs goes between "H" (0 V) and "L" (−3.0 V). The transfer signals φh1 and φh2 and the transfer signals φv1 and φv2 are similar to the transfer signals φ1 and φ2 in the first exemplary embodiment.

At the time a, the lighting signal Von goes from "H" (0 V) to "L" (−3.3 V).

At a time a1 between the time a and the time b, the transfer thyristor Th1 goes from the OFF state to the ON state. Additionally, at a time a2 between the time a1 and the time b, the transfer thyristor Tv1 goes from the OFF state to the ON state.

At the time b, the setting signal φs goes from "H" (0 V) to "L'" (−3.0 V). With this arrangement, the setting thyristor S1 goes from the OFF state to the ON state. This causes laser diode LD11 to light up as described above.

At a time b1 between the time b and the time c, the setting signal φs goes from "L'" (−3.0 V) to "H" (0 V). This causes the setting thyristor S1 to go from the ON state to the OFF state, but because the lighting signal Von is "L" (−3.3 V), the ON state of the laser diode LD11 is maintained.

With this configuration, the lighted and unlighted states of the laser diodes LD are set according to FIG. 13 in the setting periods P from the time a to the time u. Thereafter, the lighted states of the lighted laser diodes LD are maintained in the lighting maintenance period Pc from the time u to the time v. In other words, in the lighting maintenance period Pc, the laser diodes LD set to the lighted state light up in parallel.

Operations by the light source 23 not described here are similar to the operations by the light source 20 described in the first exemplary embodiment, and therefore further description is omitted.

(Full Simultaneous Lighting Operation by Light Source 23 in Light-Emitting Device 4C)

A full simultaneous lighting operation that causes all of the laser diodes LD to light up simultaneously in parallel in the light source 23 will be described.

To cause one of the laser diodes LD to light up, it is sufficient to have the gate of the driving thyristor U set to −1.5 V, cause the cathode of the driving thyristor B (anode of the driving thyristor U) to be set to −1.5 V, and set the lighting signal Von to "L" (−3.3 V).

Consequently, the reference potential supply unit 160 of the controller 110 sets the reference potential Vsub to "H" (0 V). Additionally, the power supply potential supply units 170-1 and 170-2 of the controller 113 set the power supply potentials Vgk1 and Vgk2 to "H" (0 V). Thereafter, the setting signal generation unit 180 of the controller 113 sets the setting signal φs to "L" (−3.3 V). With this configuration, the setting thyristors S go to the ON state, and the gates of the driving thyristors B go to 0 V through the connecting resistors Rc. Accordingly, the cathodes of the driving thyristors B (anodes of the driving thyristors U) go to −1.5 V. After that, if the lighting signal Von is set from "H" (0 V) to "L" (−3.3 V), the driving thyristors U turn on and enter the ON state. This causes a current to flow through the laser diodes LD, the driving thyristors B, and the driving thyristors U, and the laser diodes LD light up. In other words, all of the laser diodes LD light up simultaneously in parallel. This state is not influenced by the potentials of the other signals (the transfer signals φh1, φh2, φv1, and φv2 or the simultaneous lighting signals φg1 and φg2). Consequently, the potentials of the other terminals (φh1 terminal, φh2 terminal, φv1 terminal, φv2 terminal, φg1 terminal, and φg2 terminal) do not have to be set. That is, the potentials of the other terminals (φh1 terminal, φh2 terminal, φv1 terminal, φv2 terminal, φg1 terminal, and φg2 terminal) may be open.

(Partial Simultaneous Lighting Operation by Light Source 23 in Light-Emitting Device 4C)

A partial simultaneous lighting operation that causes a portion of the multiple laser diodes LD to light up as a group in the light source 23 will be described.

To cause one of the laser diodes LD to light up, it is sufficient to have the gate of the driving thyristor U set to −1.5 V, cause the cathode of the driving thyristor B (anode of the driving thyristor U) to be set to −1.5 V, and set the lighting signal Von to "L" (−3.3 V).

For example, in the case of causing the laser diodes LD11, LD21, LD12, and LD22 to light up simultaneously in parallel, the reference potential supply unit 160 of the controller 113 sets the reference potential Vsub to "H" (0 V). Additionally, the simultaneous lighting signal φgh1 (the simultaneous lighting signal φgh1 supplied to the anode of the simultaneous lighting diodes Dgh1 and Dgh2) of the simultaneous lighting signal generation unit 190 is set to −1.5 V, and the simultaneous lighting signal φgv1 (the simultaneous lighting signal φgv1 supplied to the anode of the simultaneous lighting diodes Dgv1 and Dgv2) of the simultaneous lighting signal generation unit 190 is set to 0 V. Thereafter, the lighting signal generation unit 140 of the controller 113 sets the lighting signal Von to "L" (−3.3 V).

When the simultaneous lighting signal φgh1 is set to −1.5 V, the h gate signal line 55 connected to the cathode of the simultaneous lighting diode Dgh1 goes to −1.5 V. In other words, the gates of the driving thyristors U11 and U21 go to −1.5 V. Similarly, the h gate signal line 56 connected to the cathode of the simultaneous lighting diode Dgh2 goes to −1.5 V. In other words, the gates of the driving thyristors U12 and U22 go to −1.5 V.

When the simultaneous lighting signal φgv1 is set to 0 V, the v gate signal line 65 connected to the cathode of the simultaneous lighting diode Dgv1 goes to 0 V. In other words, the gates of the driving thyristors B11 and B21 go to 0 V. Similarly, the v gate signal line 66 connected to the cathode of the simultaneous lighting diode Dgv2 goes to 0 V. In other words, the gates of the driving thyristors B12 and B22 go to −1.5 V. Thereafter, if the lighting signal Von is set to "L" (−3.3 V), the laser diodes LD11, LDS21, LD12, and LD22 light up simultaneously in parallel, as described above. In this way, by combining the simultaneous lighting signals φgh and φgv, the group of laser diodes LD to light up is changed and made to light up.

Note that in FIG. 12, the anodes of the simultaneous lighting diodes Dgh1 and Dgh2 are connected by wiring, and are connected to the simultaneous lighting signal φgh1 from the simultaneous lighting signal generation unit 190 of the controller 113. Similarly, the anodes of the simultaneous lighting diodes Dgh3 and Dgh4 are connected by wiring, and are connected to the simultaneous lighting signal φgh2 from the simultaneous lighting signal generation unit 190. In addition, the anodes of the simultaneous lighting diodes Dgv1 and Dgv2 are connected by wiring, and are connected to the simultaneous lighting signal φgv1 from the simultaneous lighting signal generation unit 190. Similarly, the anodes of the simultaneous lighting diodes Dgv3 and Dgv4 are connected by wiring, and are connected to the simultaneous lighting signal φgv2 from the simultaneous lighting signal generation unit 190. It is sufficient to change the combination according to the laser diodes LD made to light up simultaneously.

Also, the anode of each of the simultaneous lighting diodes Dgh and Dgv may also be connected to the simultaneous lighting signal generation unit 190 of the controller 113 individually, and the simultaneous lighting signal generation unit 190 may select which laser diodes LD to treat as a group by setting a combination of the simultaneous lighting diodes Dgh and Dgv.

Also, in the case of performing the successive lighting operation and the full simultaneous lighting operation, without performing the partial simultaneous lighting operation, the simultaneous lighting diodes Dgh and Dgv do not have to be provided. Furthermore, the simultaneous lighting signal generation unit 190 does not have to be provided in the controller 113.

The potentials described in the first to the fourth exemplary embodiments are merely examples and may be changed depending on the configuration and properties of the components.

Additionally, in the light-emitting device 4 applying the first exemplary embodiment, the light-emitting device 4A applying the second exemplary embodiment, the 4B applying the third exemplary embodiment, and the light-emitting device 4C applying the fourth exemplary embodiment, the light diffusion member 30 that causes incident light to be emitted with a widened spread angle due to diffusion is used. However, a diffractive member such as a diffractive optical element (DOE) that causes incident light to be emitted in a different direction than the incidence direction may be used instead of the light diffusion member 30.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:
1. A light-emitting device comprising:
 a light source including a plurality of light-emitting elements and a plurality of driving elements that are provided in correspondence with the plurality of light-emitting elements and drive the light-emitting elements to light up by going to an ON state; and simultaneous lighting diodes connected to the driving elements corresponding to the light-emitting elements made to light up simultaneously in parallel; and
 a controller that controls a switching between a successive lighting operation that causes the plurality of light-emitting elements to light up successively and a simultaneous lighting operation that causes the plurality of light-emitting elements to light up simultaneously in parallel, wherein the light source includes
- a power supply line set to a reference potential or a power supply potential,
- a driving signal line having one end that is connected to the power supply line and that supplies a driving signal to the driving elements, and another end that is connected to the simultaneous lighting diodes, and
- a lighting signal line that supplies a lighting signal for causing the plurality of light-emitting elements to light up, in the successive lighting operation, the controller sets the power supply line to the power supply potential and sets each driving element to the ON state with the driving signal and the lighting signal to cause each light-emitting element corresponding to each driving element to light up successively, and in the simultaneous lighting operation, the controller sets the power supply line to the reference potential and also sets the plurality of driving elements to the ON state with the driving signal through the simultaneous lighting diodes and the lighting signal to cause the plurality of light-emitting elements to light up simultaneously in parallel.

2. The light-emitting device according to claim 1, wherein the driving elements are driving thyristors, and
the driving signal is supplied to a gate of the driving thyristors and puts the driving thyristors in a ready state to switch to the ON state.

3. The light-emitting device according to claim 2, further comprising:
a diffusion member that diffuses light emitted from the light source.

4. The light-emitting device according to claim 2, further comprising:
a diffractive member that diffracts light emitted from the light source.

5. The light-emitting device according to claim 1, wherein the light-emitting elements and the driving elements are light-emitting thyristors, each light-emitting thyristor being an integration of a light-emitting element and a driving element, and
the driving signal is supplied to a gate of the light-emitting thyristors and puts the light-emitting thyristors in a ready state to switch to the ON state.

6. The light-emitting device according to claim 5, further comprising:
a diffusion member that diffuses light emitted from the light source.

7. The light-emitting device according to claim 5, further comprising:
a diffractive member that diffracts light emitted from the light source.

8. The light-emitting device according to claim 1, wherein the plurality of light-emitting elements provided in the light source is arranged in a two-dimensional array with two driving elements being provided in correspondence with each light-emitting element, and
in the simultaneous lighting operation, the controller sets the two driving elements to the ON state.

9. The light-emitting device according to claim 8, further comprising:
a diffusion member that diffuses light emitted from the light source.

10. The light-emitting device according to claim 8, further comprising:
a diffractive member that diffracts light emitted from the light source.

11. The light-emitting device according to claim 1, further comprising:
a diffusion member that diffuses light emitted from the light source.

12. The light-emitting device according to claim 1, further comprising:
a diffractive member that diffracts light emitted from the light source.

13. An optical device comprising:
the light-emitting device according to claim 1; and
a light receiver that receives reflected light that is emitted from the light source provided in the light-emitting device and reflected by an object of measurement.

14. A measuring device comprising:
the optical device according to claim 13; and
a distance specifier that specifies a distance to an object of measurement on a basis of a length of time from when light is emitted from the light source provided in the optical device until the light is received by the light receiver.

15. An information processing device comprising:
the measuring device according to claim 14; and
an authentication processing unit that performs an authentication process related to a use of the information processing device itself on a basis of a specification result from the distance specifier provided in the measuring device.

* * * * *